US009053954B2

(12) United States Patent
Yasumura et al.

(10) Patent No.: US 9,053,954 B2
(45) Date of Patent: Jun. 9, 2015

(54) METHOD FOR MANUFACTURING SEMICONDUCTOR DEVICE

(71) Applicant: Renesas Electronics Corporation, Kawasaki-shi, Kanagawa (JP)

(72) Inventors: Bunji Yasumura, Kanagawa (JP); Yoshinori Deguchi, Kanagawa (JP); Fumikazu Takei, Kanagawa (JP); Akio Hasebe, Kanagawa (JP); Naohiro Makihira, Kanagawa (JP); Mitsuyuki Kubo, Kanagawa (JP)

(73) Assignee: RENESAS ELECTRONICS CORPORATION, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/194,874

(22) Filed: Mar. 3, 2014

(65) Prior Publication Data

US 2014/0287541 A1 Sep. 25, 2014

(30) Foreign Application Priority Data

Mar. 22, 2013 (JP) ................................. 2013-061088

(51) Int. Cl.
*H01L 21/30* (2006.01)
*H01L 25/065* (2006.01)
*H01L 23/544* (2006.01)
*H01L 21/66* (2006.01)

(52) U.S. Cl.
CPC ............ *H01L 25/0657* (2013.01); *H01L 22/14* (2013.01); *H01L 23/544* (2013.01)

(58) Field of Classification Search
CPC ..................... H01L 22/12; H01L 2021/60075; H01L 23/544
USPC .................................. 438/455–458, 460–465
See application file for complete search history.

(56) References Cited

U.S. PATENT DOCUMENTS

2005/0139882 A1\* 6/2005 Xianyu et al. ................. 257/295

FOREIGN PATENT DOCUMENTS

| JP | 2005-175263 A | 6/2005 |
| JP | 2008-153499 A | 7/2008 |
| JP | 2009-260373 A | 11/2009 |
| JP | 2011-049318 A | 3/2011 |

\* cited by examiner

*Primary Examiner* — Brook Kebede
(74) *Attorney, Agent, or Firm* — Miles & Stockbridge P.C.

(57) ABSTRACT

To improve the assemblability of a semiconductor device. When a memory chip is mounted over a logic chip, a recognition range including a recognition mark formed at a back surface of the logic chip is imaged and a shape of the recognition range is recognized, alignment of a plurality of bumps of the logic chip and a plurality of projection electrodes of the above-described memory chip is performed based on a result of the recognition, and the above-described memory chip is mounted over the logic chip. At this time, the shape of the recognition range is different from any portion of an array shape of the bumps, as a result, the recognition mark in the shape of the recognition range can be reliably recognized, and alignment of the bumps of the logic chip and the projection electrodes of the above-described memory chip is performed with high accuracy.

20 Claims, 38 Drawing Sheets

FIG. 4
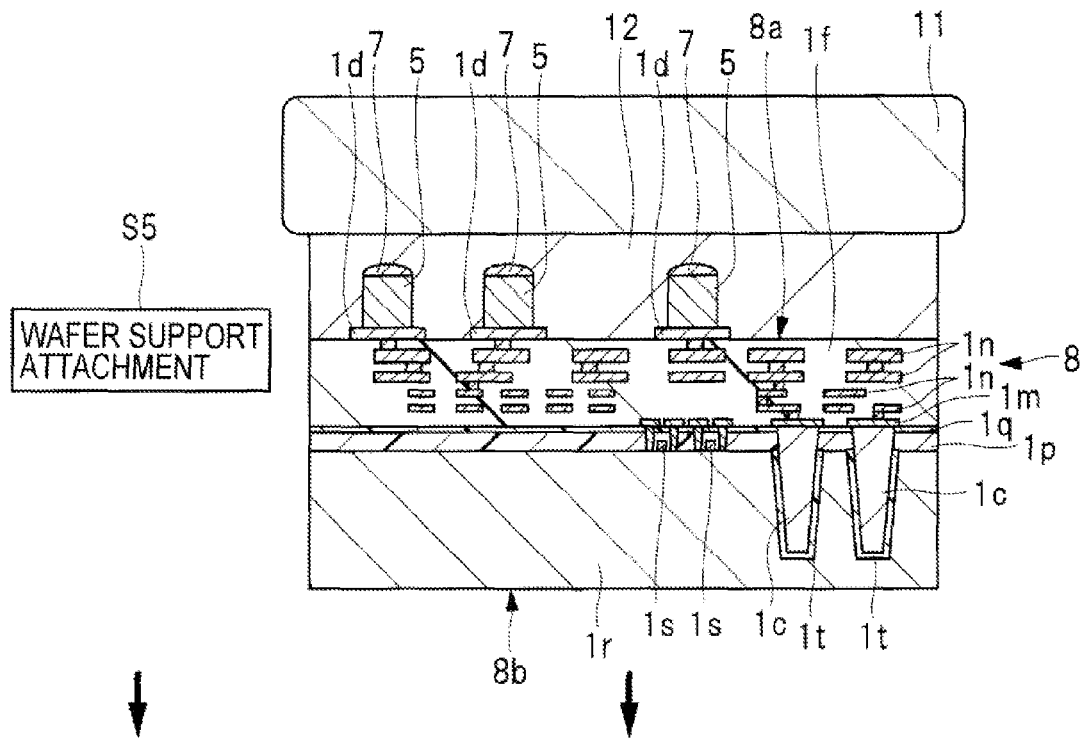
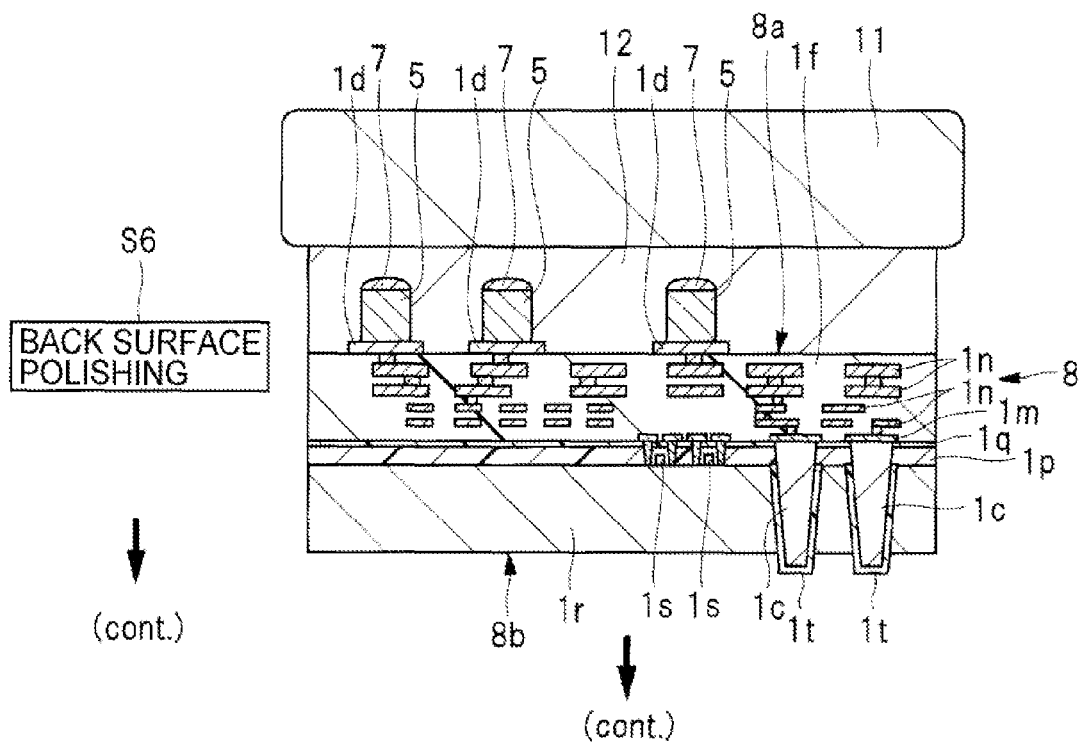

METHOD FOR MANUFACTURING SEMICONDUCTOR DEVICE

CROSS-REFERENCE TO RELATED APPLICATION

The disclosure of Japanese Patent Application No. 2013-061088 filed on Mar. 22, 2013 including the specification, drawings and abstract is incorporated herein by reference in its entirety.

BACKGROUND

The present invention relates to a manufacturing technology of a semiconductor device, and for example, to a technology effective in applying to assembly of a semiconductor device having a semiconductor chip in which through electrodes have been formed.

For example, in Japanese Patent Laid-Open No. 2009-260373 (Patent Document 1), there is disclosed a structure in which an alignment mark is formed on a surface where a pad of a semiconductor chip has been formed, and in which the alignment mark is used as a test-dedicated pad which a probe and the like touch.

In addition, for example, in Japanese Patent Laid-Open No. 2005-175263 (Patent Document 2), there is disclosed a technology in which alignment marks that are formed in the same step as a step of forming through electrodes and that have the same structure as each other are formed on a substrate, and in which alignment of a semiconductor chip to be stacked and the substrate is performed using the alignment marks.

In addition, for example, in Japanese Patent Laid-Open No. 2011-49318 (Patent Document 3), there is disclosed a structure in which a plurality of circuit regions is formed on an upper surface of a wafer, and in which an alignment mark is provided inside the respective circuit regions, and furthermore, it is described in this Patent Document 3 that tips of through electrodes formed on the wafer can be used as the alignment marks.

In addition, for example, it is disclosed in Japanese Patent Laid-Open No. 2008-153499 (Patent Document 4) that elements, constituting a semiconductor circuit, such as a transistor and a resistor, and wirings that should be coupled to the elements are sequentially formed on a semiconductor wafer on the basis of alignment marks, and that through-holes are formed in the semiconductor wafer, and electrodes and through electrodes are formed.

SUMMARY

In a flow of a technology of reduction in size and high-density mounting of a semiconductor device (semiconductor package), currently, development of three-dimensional mounting technologies to achieve an SIP (System In Package) through the use of a three-dimensional structure has been performed vigorously. Among the three-dimensional mounting technologies, particularly, the TSV (Through Silicon Via (silicon through electrode)) technology is a technology effective in reduction in size while stacking a number of chips, in which through-holes are bored in chips in a wafer state, a conductive material is buried in the through-holes for the formation of through electrodes, and in which stacked chips are electrically coupled to one another via the through electrodes.

As one example of a semiconductor device using this TSV technology, there can be exemplified the semiconductor device in which there has been performed flip-chip mounting of a first semiconductor chip (for example, a logic chip) provided with through electrodes over a wiring substrate (package substrate), and in which there has been further mounted (stacked) a second semiconductor chip (for example, a memory chip) provided with projection electrodes over a back surface of the first semiconductor chip. Electrode pads corresponding to the through electrodes are provided on the back surface of the first semiconductor chip, and the second semiconductor chip is electrically coupled to the first semiconductor chip through the above-mentioned projection electrodes, electrode pads, and through electrodes.

Such semiconductor device is assembled in the following procedures in many cases.

1) An alignment mark formed on the wiring substrate is recognized by a recognition unit of a chip mounting machine.

2) The first semiconductor chip is mounted over the wiring substrate based on a recognition result of 1).

3) The alignment mark formed on the wiring substrate is recognized again by the recognition unit of the chip mounting machine.

4) The second semiconductor chip is mounted over the first semiconductor chip based on a recognition result of 3).

However, the inventor of the present application has found out that, when the alignment mark formed on the wiring substrate is used in common in the above-described 1) and 3) steps as described above, position deviation (an mounting error or variation in mounting accuracy) of the first semiconductor chip with respect to the wiring substrate is added to position deviation of the second semiconductor chip with respect to the first semiconductor chip. That is, in the above-described 3) and 4) steps in which the alignment mark formed on the wiring substrate is recognized, and in which the second semiconductor chip is mounted over the first semiconductor chip. Accuracy of positions of the second semiconductor chip and the wiring substrate can be absolutely ensured, but accuracy of positions of the second semiconductor chip and the first semiconductor chip cannot be ensured. In addition to that, in recent years, an adjacent pitch between a plurality of through electrodes formed at the first semiconductor chip is becoming narrower, for example, approximately 50 μm, and an adjacent pitch of a plurality of electrode pads corresponding to the respective through electrodes is becoming substantially the same. Therefore, when even slight position deviation occurs between the electrode pad of the first semiconductor chip and the projection electrode of the second semiconductor chip, stable coupling of the first semiconductor chip and the second semiconductor chip (stable coupling of the electrode pads and the projection electrodes) cannot be secured.

Consequently, the inventor of the present application has examined that the alignment mark used in the above-described 3) step is provided over the back surface of the first semiconductor chip in order to enhance (stabilize) alignment accuracy of the first semiconductor chip and the second semiconductor chip. However, the inventor of the present application has found out a further problem that a shape of the alignment mark may approximate to an array shape of the plurality of electrode pads in some cases, which causes false recognition at the time of recognition.

An object of an embodiment disclosed in the present application is to provide a technology to be able to enhance assemblability of a semiconductor device.

The other problems and the new feature will become clear from the description of the present specification and the accompanying drawings.

A method for manufacturing a semiconductor device of one embodiment has a step of mounting a second semiconductor chip over a first semiconductor chip, in which a plurality of electrode pads and a recognition mark are arranged over a main surface of the first semiconductor chip, and in which when the above-described second semiconductor chip is mounted, a recognition range including the above-described recognition mark of the first semiconductor chip is imaged and a shape of the above-described recognition range is recognized. Furthermore, alignment of the electrode pads of the first semiconductor chip and a plurality of projection electrodes of the second semiconductor chip is performed on the basis of a result of the above-described recognition, and the second semiconductor chip is mounted over the first semiconductor chip. In that case, a shape of the above-described recognition range is different from any portion of an array shape of the above-described electrode pads.

According to the above-described one embodiment, assemblability of the semiconductor device can be enhanced.

BRIEF DESCRIPTION OF THE DRAWINGS

FIG. 4 shows partial cross-sectional views each of which illustrates one example of a structure of the semiconductor device of FIG. 1 after from wafer support attachment to back surface polishing of the assembly thereof;

DETAILED DESCRIPTION

In the following embodiments, explanation of the same or similar portion is not repeated as a principle except for the case where it is necessary in particular.

Furthermore, the following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In addition, in the following embodiments, when referring to the number of elements or the like (including the number, a numeric value, an amount, a range, and the like) they may be not restricted to the specific number but may be greater or smaller than the specific number, except for such cases where they are clearly specified in particular and where they are clearly restricted to a specific number theoretically.

Furthermore, in the following embodiments, it is needless to say that an element (including an element step and the like) is not necessarily indispensable, except for such cases where it is clearly specified in particular and where it is considered to be clearly indispensable from a theoretical point of view.

In addition, in the following embodiments, it is needless to say that when "comprising A", "containing A", "having A", and "including A" are described in regard to an element or the like, the other elements are not eliminated except for such a case where it is clearly specified in particular that only the element is included. Similarly, in the following embodiments, when shape, position relationship, and the like of an element or the like are referred to, what resembles or is similar to the shape substantially shall be included, except for the case where it is clearly specified in particular and where it is considered to be clearly not right from a theoretical point of view. This statement also applies to the numeric value and range described above.

Hereinafter, an embodiment will be explained in detail based on drawings. It should be noted that in all the drawings for explaining the embodiment, the same symbol is attached to a member having the same function, and the repeated explanation thereof is omitted. In addition, in order to make a drawing intelligible, hatching may be attached even if it is a plan view.

Embodiment

Figure 1:
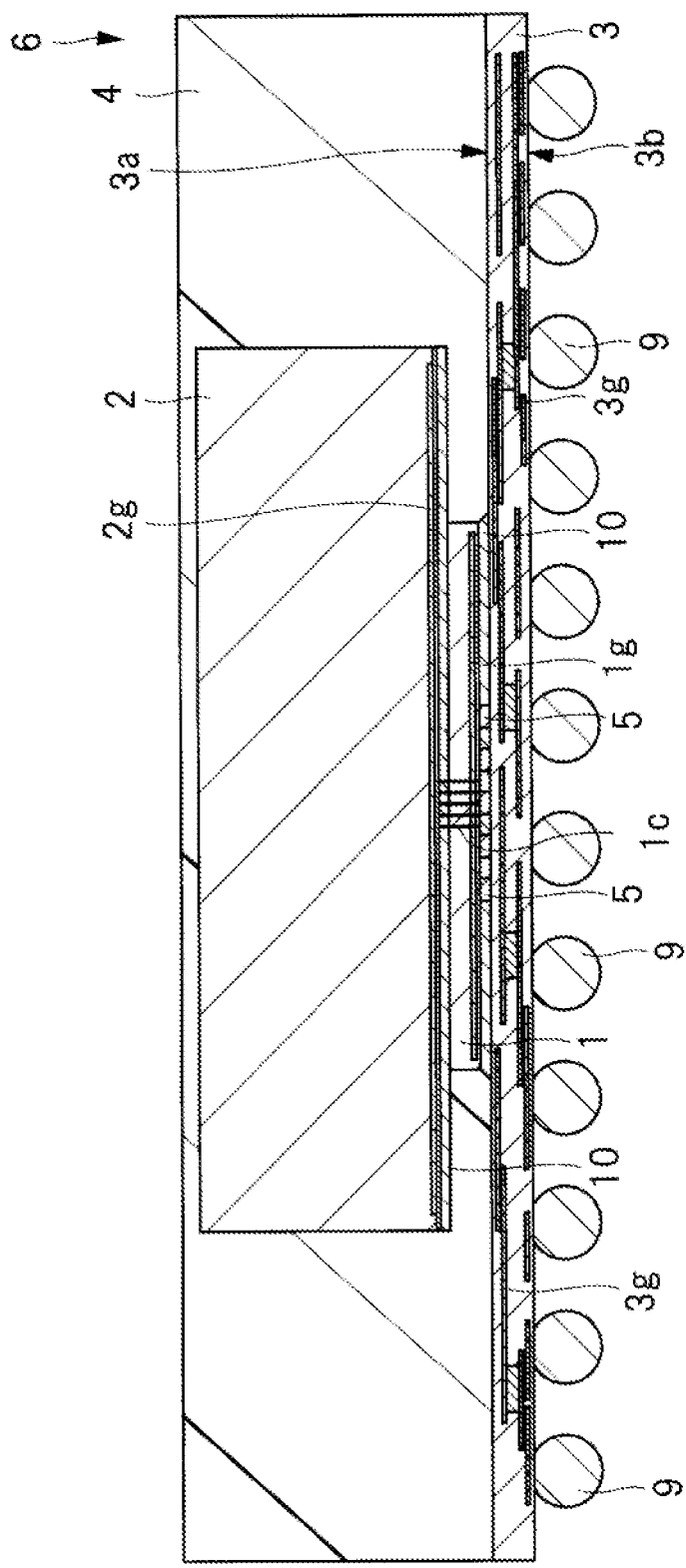
FIG. 1 is a cross-sectional view illustrating one example of a structure of a semiconductor device of an embodiment.

FIG. 1 is a cross-sectional view illustrating one example of a structure of a semiconductor device of an embodiment.

The semiconductor device of the present embodiment is, as shown in FIG. 1, a semiconductor package in which a plurality of semiconductor chips has been stacked over a package substrate (wiring substrate) 3 on which a wiring has been formed, and in the present embodiment, as one example of the above-described semiconductor package, there will be taken up and explained a BGA (Ball Grid Array) 6 in which a plurality of ball electrodes 9 serving as external coupling terminals has been provided in a lattice form on a lower surface (back surface) 3b side of the package substrate 3. It should be noted that the ball electrode 9 is, for example, a solder ball.

When a detailed structure of the BGA 6 is explained, two semiconductor chips are mounted on the BGA 6 in a state of being stacked. In these two semiconductor chips, the semiconductor chip arranged at a lower-stage side is a logic chip (a semiconductor chip or a microcomputer chip provided with a microcomputer) 1, whereas the semiconductor chip on an upper-stage side that has been stacked over the logic chip 1 is a memory chip 2. It should be noted that the logic chip 1 and the memory chip 2 are electrically coupled, and that the memory chip 2 of the upper-stage side is controlled by the logic chip 1 on the lower-stage side. Accordingly, the BGA 6 of the present embodiment can also be said to be an SIP (System In Package)-type semiconductor package.

It should be noted that flip-chip mounting of the logic chip 1 is performed over the package substrate 3 via a plurality of copper (Cu) post bumps (copper pillar bumps, metal bumps, or metallic projection electrodes) 5, being projection electrodes. That is, as shown in FIG. 8 which will be mentioned later, the logic chip 1 is arranged so that a front surface (first main surface) 1a where elements have been formed and the plurality of copper post bumps 5 has been arranged faces an upper surface (front surface) 3a of the package substrate 3, and the logic chip 1 is mounted over the upper surface 3a of the package substrate 3.

Furthermore, a plurality of through electrodes is formed in the logic chip 1. The through electrodes 1c are formed penetrating a silicon base portion, and are electrically coupled to electrodes formed on the front and back surfaces of the chip.

Figure 8:
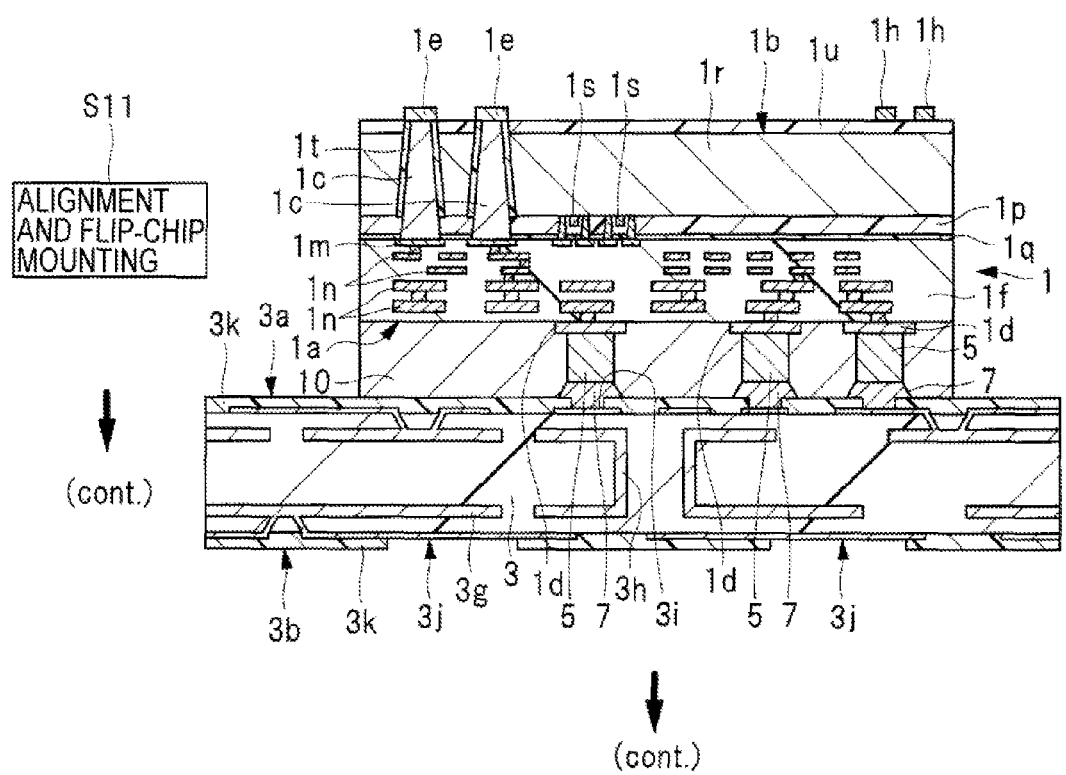
FIG. 8 is a partial cross-sectional view illustrating one example of a structure of the semiconductor device of FIG. 1 after flip-chip mounting of a lower-stage chip of the assembly thereof.

As shown in FIG. 8, one ends of the through electrodes 1c in the logic chip 1 of the BGA 6 are electrically coupled to one ends of wiring portions 1g formed at an insulating layer 1f of a surface layer on a front surface (an element formation surface or a lower surface) 1a side of the logic chip 1. Furthermore, the other ends of the wiring portions 1g are electrically coupled to pads 1d formed on the front surface 1a of the logic chip 1. Furthermore, the pads 1d are electrically coupled to the copper post bumps 5. In addition, the other ends of the through electrodes 1c are electrically coupled to bumps (electrode pads) 1e provided on a back surface (a second main surface or an upper surface) 1b side of an opposite side of the front surface 1a of the logic chip 1. That is, the bumps 1e provided on the back surface 1b of the logic chip 1 are electrically coupled to the through electrodes 1c, the wiring portions 1g, the pads 1d, and the copper post bumps 5 in that order from the back surface 1b to the front surface 1a of the logic chip 1.

Furthermore, as shown in FIG. 8, the bumps 1e provided on the back surface 1b of the logic chip 1 and pads 2d provided at a front surface 2a of the memory chip 2 are electrically coupled to one another, and thus the logic chip 1 and the memory chip 2 stacked over the back surface 1b of the logic chip 1 are electrically coupled to each other.

Figure 10:
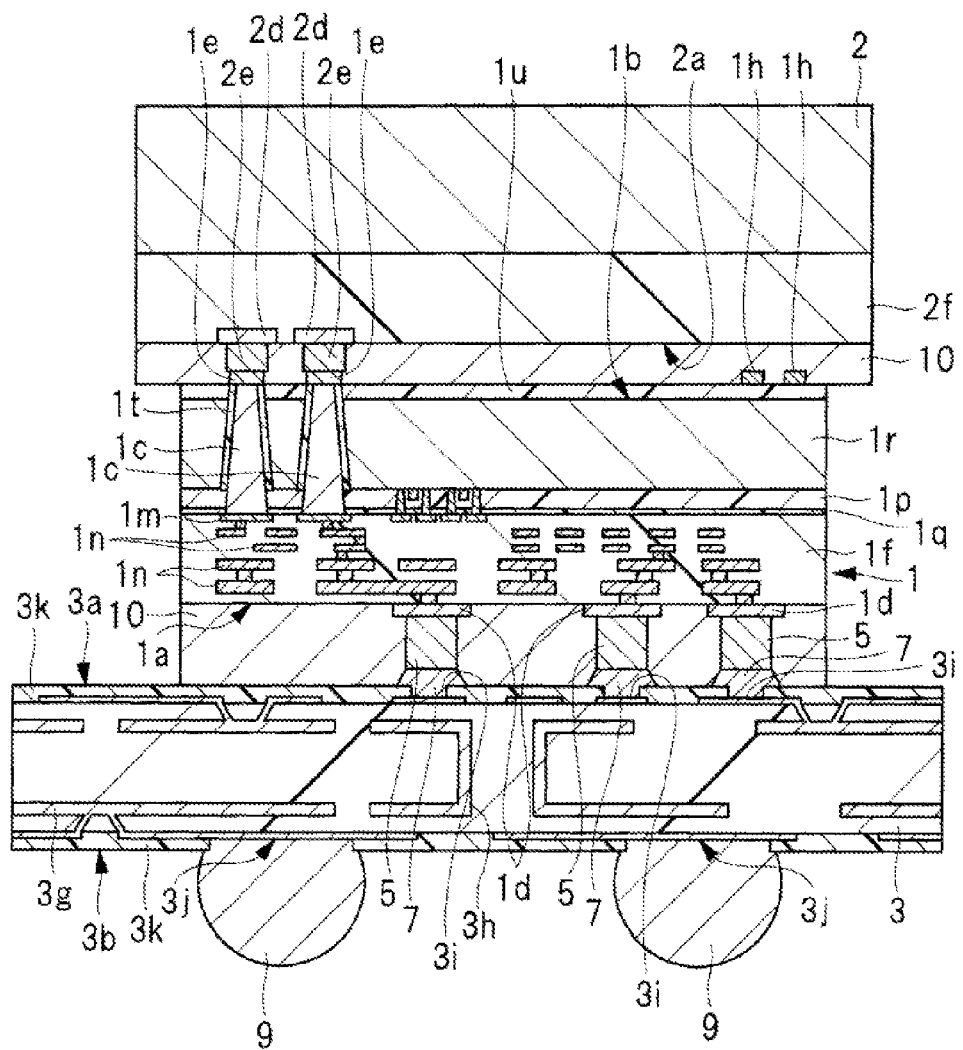
FIG. 10 is a partial cross-sectional view illustrating one example of a structure of the semiconductor device of FIG. 1 after flip-chip mounting of an upper-stage chip of the assembly thereof.

Specifically, as shown in FIG. 10, the bumps (electrode pads) 1e arranged in a matrix form are formed on the back surface 1b of the logic chip 1, whereas a plurality of bumps 2e corresponding to the bumps 1e is arranged over the front surface 2a of the memory chip 2, and flip-chip coupling of the memory chip 2 and the logic chip 1 is performed through the bumps 2e coupled to the bumps 1e.

In addition, the bumps 1e are formed on the back surface 1b of the logic chip 1. Furthermore, there are formed recognition marks 1h for recognizing a chip position used for alignment, in a probe inspection step or a flip-chip mounting step among assembly steps of the BGA 6.

That is, the recognition marks 1h are used to recognize them formed on the back surface (upper surface) 1b of the logic chip 1 and to perform alignment of the logic chip 1, in the probe inspection step and the flip-chip mounting step in the assembly steps of the BGA 6.

In addition, the BGA 6 has a structure in which a power source, a GND, and a signal are supplied from the package substrate 3 to the memory chip 2 of the upper-stage side, via the logic chip 1.

It should be noted that as one example, a pitch of the copper post bumps 5 is approximately not more than 100 µm, whereas a pitch of the bumps 1e of the opposite side is approximately 50 µm, and that in these ranges, there is satisfied a relation of an electrode pitch of the copper post bumps 5>an electrode pitch of the bumps 1e. In addition, a pitch in a planar view of the through electrodes 1c arranged directly under the respective bumps 1e is also approximately 50 µm similarly to the electrode pitch of the bumps 1e. Additionally, the package substrate 3 and the logic chip 1 are electrically coupled to each other via the copper post bumps 5.

It should be noted that, as shown in FIG. 8, on the upper surface 3a of the package substrate 3, there are formed a plurality of lands (first pad electrodes) 3i and a solder resist film (insulating film) 3k that covers an outer peripheral portion of the lands 3i, and that the copper post bumps 5 are electrically coupled to exposed portions of the respective lands 3i via, for example, solders 7 which are conductive materials.

Meanwhile, on the lower surface 3b of the package substrate 3, there are formed a plurality of lands 3j and the solder resist film (insulating film) 3k that covers an outer peripheral portion of the lands 3j, and the ball electrodes 9 serving as the external coupling terminals are electrically coupled to exposed portions of the respective lands 3j.

In addition, the lands 3i of the upper surface 3a and the lands 3j of the lower surface 3b of the package substrate 3 are electrically coupled via an internal wiring 3g and a through-hole wiring 3h.

In addition, as shown in FIG. 1, the logic chip 1 and the memory chip 2 that have been stacked over the package substrate 3 are resin-sealed by a sealing body 4 including, for example, epoxy resin or the like.

Next, a method for manufacturing a semiconductor device of the present embodiment will be explained.

Figure 2:
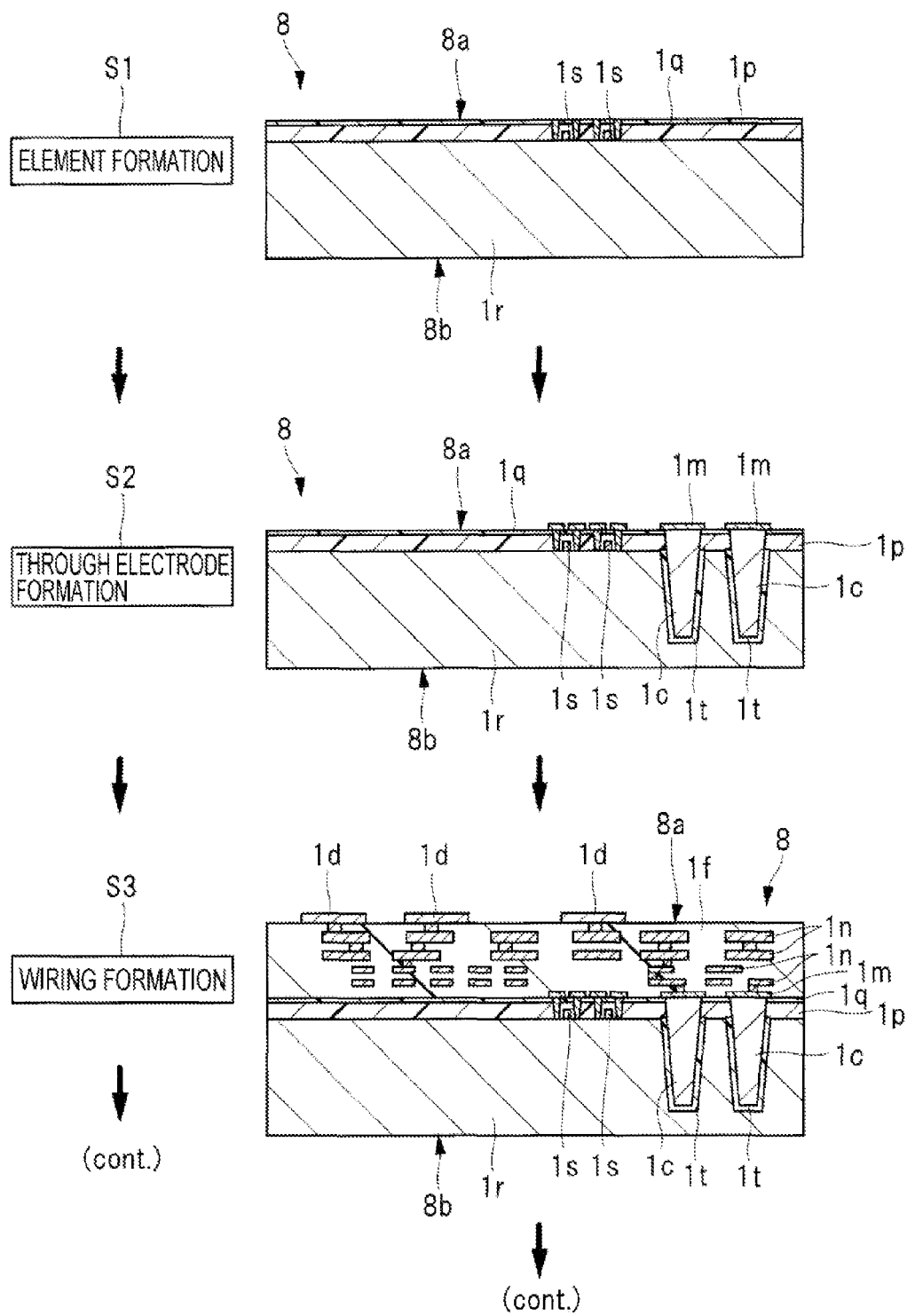
FIG. 2 shows partial cross-sectional views each of which illustrates one example of a structure of the semiconductor device of FIG. 1 after from element formation to wiring formation of assembly thereof.
Figure 3:
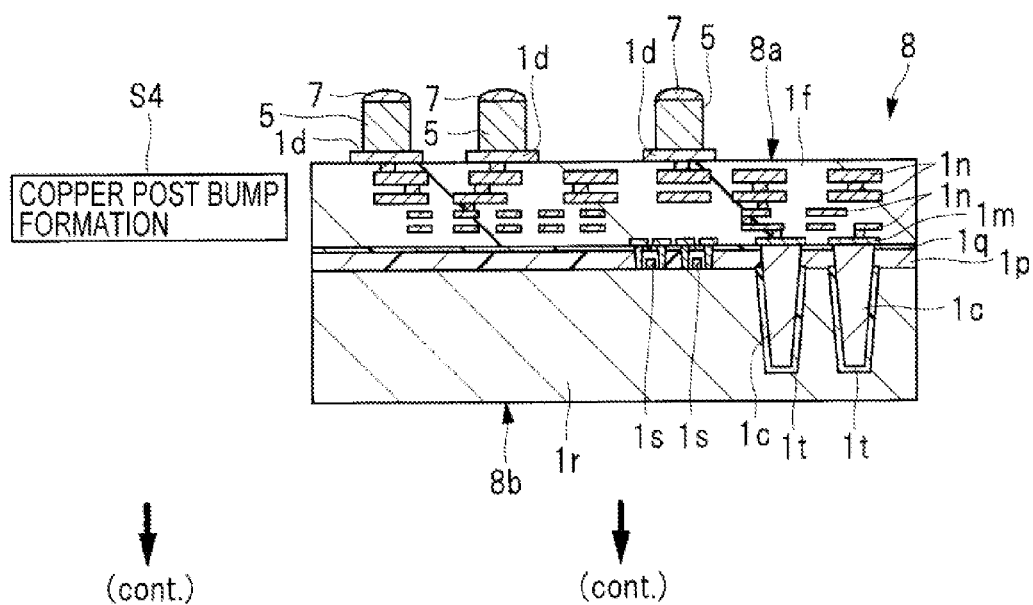
FIG. 3 is a partial cross-sectional view illustrating one example of a structure of the semiconductor device of FIG. 1 after copper post bump formation of the assembly thereof.
Figure 5:
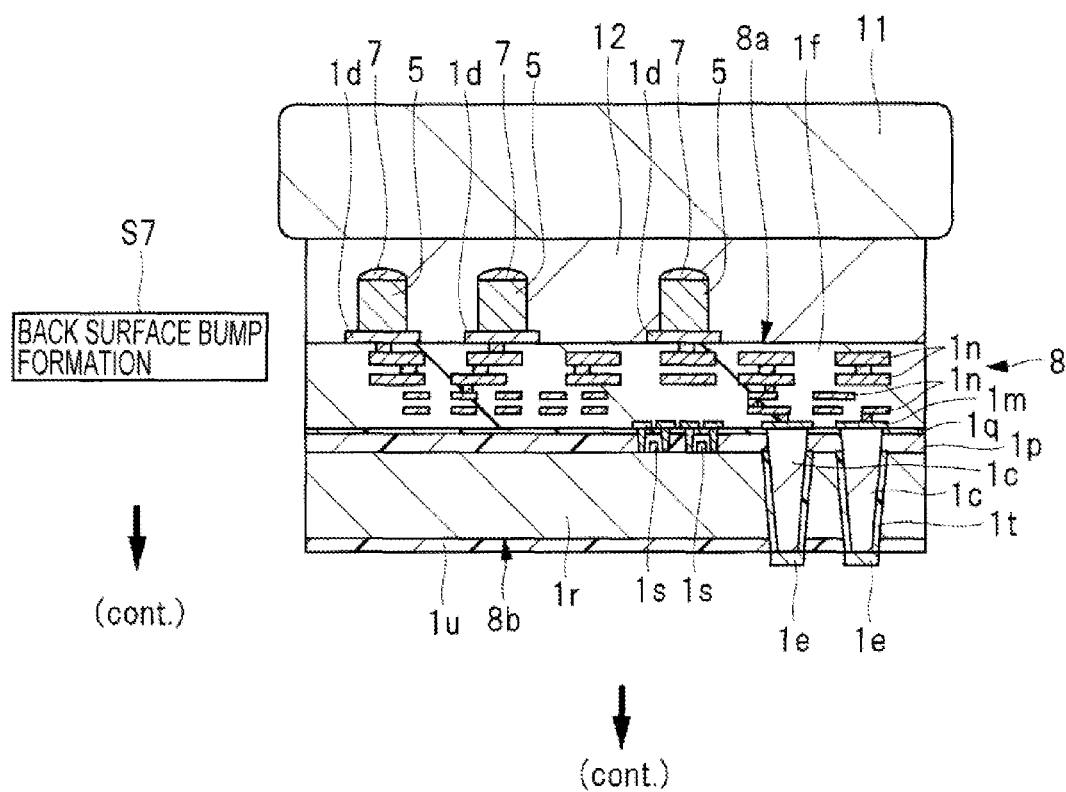
FIG. 5 is a partial cross-sectional view illustrating one example of a structure of the semiconductor device of FIG. 1 after back surface bump formation in the assembly thereof.
Figure 6:
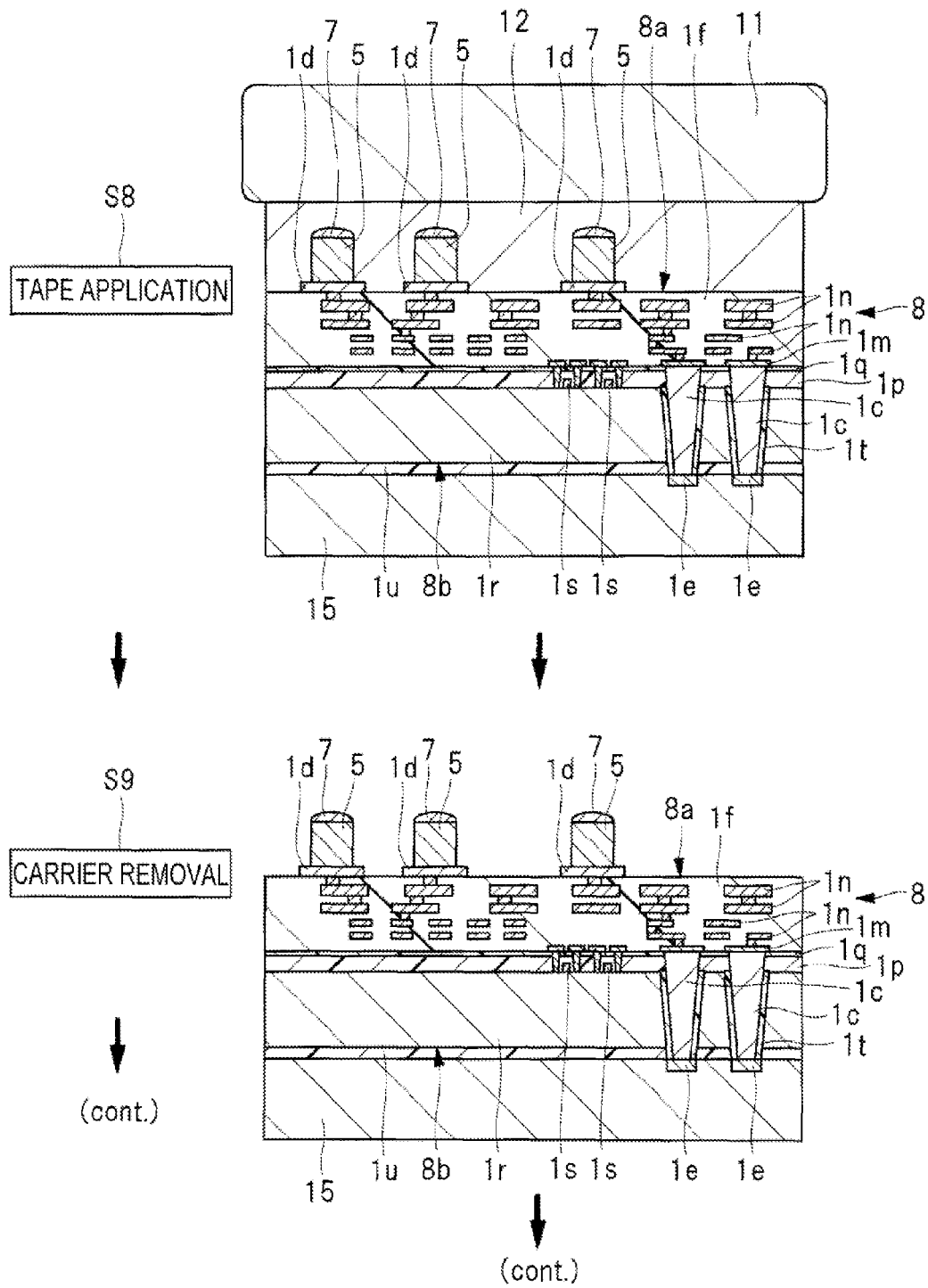
FIG. 6 shows partial cross-sectional views each of which illustrates one example of a structure of the semiconductor device of FIG. 1 after from tape application to carrier removal of the assembly thereof.
Figure 7:
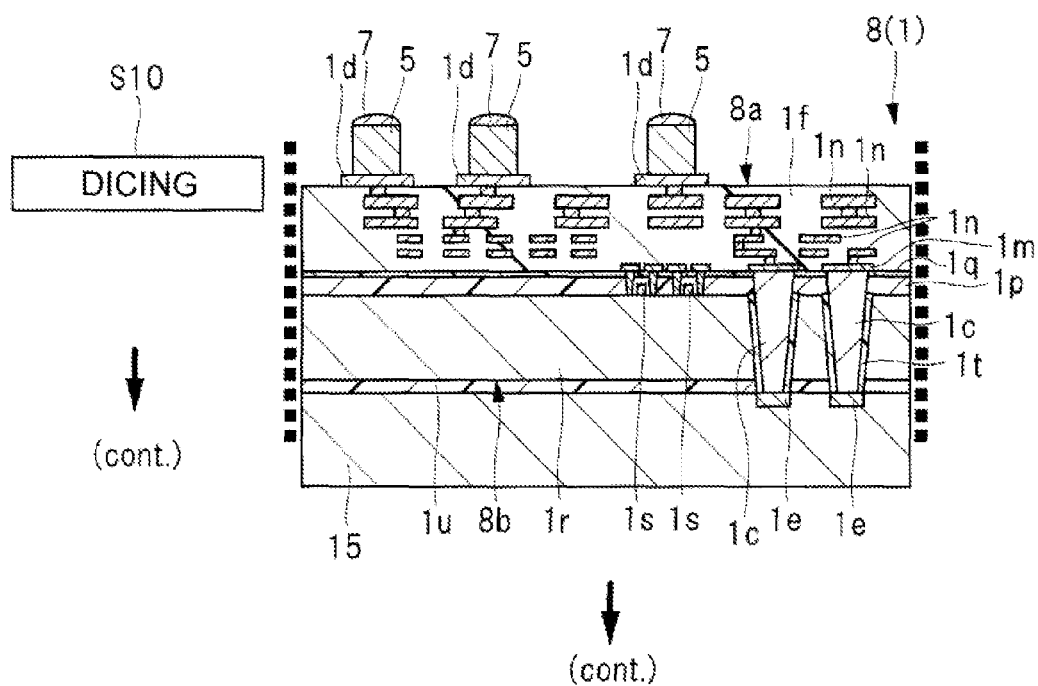
FIG. 7 is a partial cross-sectional view showing one example of a structure of the semiconductor device of FIG. 1 after dicing of the assembly thereof.
Figure 9:
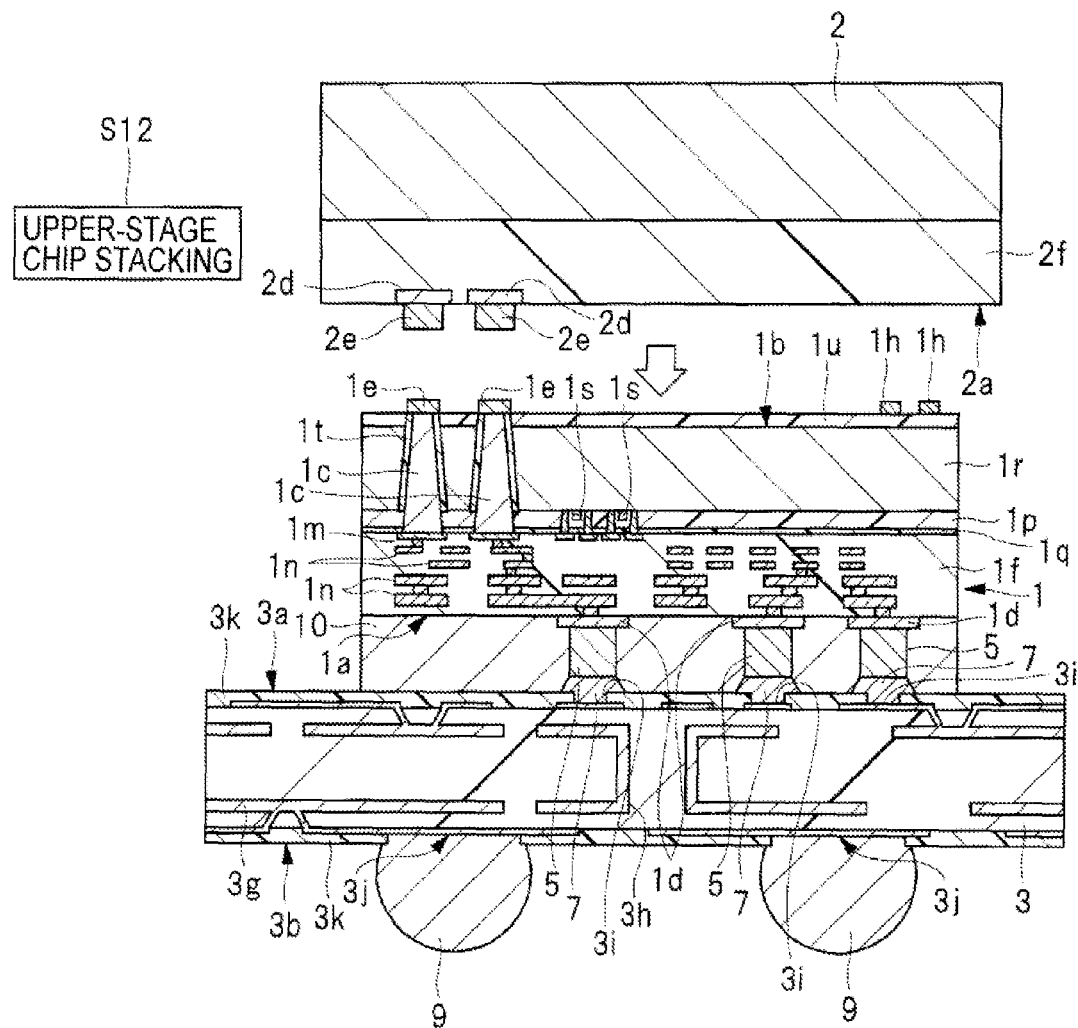
FIG. 9 is a partial cross-sectional view illustrating one example of a structure of the semiconductor device of FIG. 1 at the time of alignment of the assembly thereof.

FIG. 2 shows partial cross-sectional views each of which illustrates one example of a structure of the semiconductor device of FIG. 1 after from element formation to wiring formation of assembly thereof, FIG. 3 is a partial cross-sectional view illustrating one example of a structure of the semiconductor device of FIG. 1 after copper post bump formation of the assembly thereof, and FIG. 4 shows partial cross-sectional views each of which illustrates one example of a structure of the semiconductor device of FIG. 1 after from wafer support attachment to back surface polishing of the assembly thereof. In addition, FIG. 5 is a partial cross-sectional view illustrating one example of a structure of the semiconductor device of FIG. 1 after back surface bump formation in the assembly thereof, FIG. 6 shows partial cross-sectional views each of which illustrates one example of a structure of the semiconductor device of FIG. 1 after from tape application to carrier removal of the assembly thereof, and FIG. 7 is a partial cross-sectional view showing one example of a structure of the semiconductor device of FIG. 1 after dicing of the assembly thereof. Furthermore, FIG. 8 is a partial cross-sectional view illustrating one example of a structure of the semiconductor device of FIG. 1 after flip-chip mounting of a lower-stage chip of the assembly thereof, FIG. 9 is a partial cross-sectional view illustrating one example of a structure of the semiconductor device of FIG. 1 at the time of alignment of the assembly thereof, and FIG. 10 is a partial cross-sectional view illustrating one example of a structure of the semiconductor device of FIG. 1 after flip-chip mounting of an upper-stage chip of the assembly thereof.

First, element formation shown in step S1 of FIG. 2 is performed. Here, elements is are formed at a front surface 8a of a semiconductor wafer (hereinafter also simply referred to as a wafer) 8, which is a semiconductor substrate. Namely, elements 1s such as transistors, are formed at surface layer including an insulating layer 1p and protection film 1q over a base substrate 1r including silicon.

Next, through electrode formation of step S2 is performed. Here, first, a metal layer 1m is formed over the front surface 8a of the wafer 8, and after that, the through electrodes 1c electrically coupled to the metal layer 1m are formed in the wafer 8. It should be noted that front surfaces of the respective through electrodes is are covered with an insulating film 1t of $SiO_2$ (also including TiN) or the like, which prevents diffusion of the through electrodes 1c. An inter-electrode pitch of the through electrodes 1c is, for example, approximately 50 µm here.

Next, wiring formation of step S3 is performed. Here, first, a metal layer in is formed in the insulating layer 1f over the front surface (a first surface) 8a. Namely, the metal layer in electrically coupled to the through electrodes 1c is formed over the metal layer 1m. The metal layer 1n includes a plurality of wiring layers, and an interlayer insulating film is respectively formed between the respective wiring layers.

Furthermore, the pads 1d electrically coupled to the metal layer in are formed over the insulating layer 1f. The pad 1d is, for example, the pad formed of aluminum (Al) here.

Next, copper post bump formation of step S4 of FIG. 3 is performed. Here, the copper post bumps 5, being the plurality of projection electrodes electrically coupled to the metal layer 1n, are formed over the metal layer 1n. Namely, the copper post bumps 5, which are the projection electrodes, are formed over the pads 1d that have been formed over the insulating layer 1f and have been electrically coupled to the metal layer 1n. Furthermore, the solders 7 are formed over the respective copper post bumps 5. It should be noted that although the post bumps including copper (Cu) are exemplified and explained here, the present invention is not limited to this, and other metal post bumps may be used.

In addition, the copper post bumps 5 are, for example, provided at a pitch not more than 100 µm here. Since the number of terminals of the through electrodes 1c required on an memory chip side is more than the number of copper post bumps coupled to a package substrate side, a relation of an electrode pitch of each of the copper post bumps 5>an electrode pitch of each of the through electrodes 1c, is satisfied.

Next, probe inspection is carried out. Namely, after the copper post bumps 5 are formed, probing is performed (a test probe, which is not shown, is applied) on the copper post bumps 5, and a first probe inspection, which is an electric test, is performed. This first probe inspection is the one to perform quality determination of the logic chip 1 formed on the wafer 8, and is performed to a plurality of logic chips 1 formed in a chip region of the wafer 8.

Next, wafer support attachment shown in step S5 of FIG. 4 is performed. Here, a front surface 8a side of the wafer 8 is applied to a carrier 11 through an adhesive 12. It should be noted that the carrier 11 is, for example, a glass carrier including silica glass or the like. In addition, the adhesive 12 is, for example, an organic-based adhesive. However, the adhesive 12 is not limited to the organic-based adhesive and an electrically conductive adhesive or the like may be used.

Next, back surface polishing (grinding or back grinding) shown in step S6 of FIG. 4 is performed. Here, a back surface 8b, on a side opposite to the front surface 8a of the wafer 8 is polished (ground), and there is exposed a tip (a part) of each of the through electrodes 1c previously formed in step S2. Polishing at this time is, for example, polishing, chemical etching or the like.

Next, back surface bump formation shown in step S7 of FIG. 5 is performed. Here, first, an insulating film 1u is formed around the tips of the through electrodes 1c exposed to the back surface 8b of the wafer 8. This insulating film 1u is, for example, an $SiO_2$ (also including TiN) film or the like. Furthermore, the bump 1e is formed at each of the tips of the through electrodes 1c exposed to the back surface 8b side. The bump 1e is, for example, formed by plating or the like. In addition, the bump 1e, for example, includes gold (Au) or the like in many cases.

As a result, the bumps 1e are formed on the back surface 8b of the wafer 8. It should be noted that since the respective bumps 1e are formed at the tips of the through electrodes 1c exposed to the back surface 8b of the wafer 8, the electrode pitch of the bumps 1e is the same as the pitch of the through electrodes 1c. Therefore, in the front and back surfaces of the wafer 8, a relation of the electrode pitch of the respective copper post bumps 5>the electrode pitch of the respective bumps 1e (through electrodes 1c) is satisfied.

Next, a probe inspection is carried out. Here, there is carried out a second probe inspection to inspect an electrical coupling state (a conductive state) of the copper post bumps 5 and the bumps 1e. It should be noted that in the second probe inspection, the wafer 8 is supported in a state where the carrier 11 is applied to the wafer 8, and that conduction between the electrodes of the respective bumps 1e is confirmed in this state.

That is, the second probe inspection is the one to perform quality determination of the respective through electrodes 1c formed in the wafer 8 (in the chip).

It should be noted that, in, the second probe inspection, there are recognized the recognition marks 1h formed on the back surface 1b of the logic chip 1 shown in FIG. 8, and on the basis of this recognition result, a test needle of the probe is brought into contact with the bumps 1e of the back surface 1b of the logic chip 1, whereby the probe inspection I carried out.

After the above-described second probe inspection is completed, tape application shown in step S8 of FIG. 6 is performed. Here, the back surface 8b side of the wafer 8 on which the above-described second probe inspection has been carried out is applied to a dicing tape 15.

Next, carrier removal shown in step S9 is performed. Here, the carrier 11 applied to the front surface 8a side through the adhesive 12 is removed (eliminated) from the wafer 8, on which the above-described second probe inspection has been finished and to which the dicing tape 15 has been applied. Furthermore, etching is performed to remove the adhesive 12. At this time, the adhesive 12 is removed by etching and other foreign substances can also be removed, and cleaning of the copper post bumps 5 and an element formation surface (front surface 8a) can be performed.

Next, dicing shown in step S10 of FIG. 7 is performed. Here, the wafer 8 supported by the dicing tape 15 is cut off, and a plurality of good semiconductor chips (logic chips 1 here) are obtained.

Next, flip-chip mounting is performed.

Here, there is performed flip-chip mounting of the logic chip (lower-stage chip) 1 shown in step S11 in FIG. 8. First, the package substrate (a wiring substrate or a multiple substrate) 3 is prepared. It should be noted that the lands 3i coupled to the copper post bumps 5 of the logic chip 1 are formed on the upper surface 3a of the package substrate 3, whereas the lands 3j electrically coupled to the lands 3i are formed on the lower surface 3b on a side opposite to the upper surface 3a of the package substrate 3.

In addition, the solder resist film 3k is formed on a surface layer of each of the upper and lower surfaces of the package substrate 3, and parts of the respective lands 3i and 3j are exposed thereto.

After the package substrate 3 is prepared, the logic chip 1 determined to be good by the second probe inspection is mounted over the upper surface 3a of the package substrate 3, and is heated and pressurized, whereby the package substrate 3 and the copper post bumps 5 are electrically coupled via the solders 7 formed over the copper post bumps 5. After that, an under filling 10, which is liquid-like sealing resin, is injected into a gap between the logic chip 1 and the package substrate 3, and the gap is filled with the under filling 10. It should be noted that, as to the injection and filling, the under filling 10, which is liquid-like sealing resin, is previously applied on the package substrate 3, and by the mounting of the logic chip 1, there may be performed, simultaneously, electrical coupling of the copper post bumps 5 and the package substrate 3, and resin filling for the gap between the logic chip 1 and the package substrate 3.

Next, a probe inspection is carried out. Here, there is carried out a third probe inspection to inspect an electrical coupling state of the logic chip 1 and the package substrate 3. It should be noted that, in the third probe inspection, there are recognized the recognition marks 1h formed on the back surface 1b of the logic chip 1, and on the basis of this recognition result, a test needle of the probe is brought into contact with the bumps 1e of the back surface 1b of the logic chip 1, whereby the conduction inspection is performed.

By the third probe inspection, it can be confirmed whether or not conduction of the logic chip 1 and the package substrate 3 is reliably secured.

Next, there is performed stacking of the memory chip (upper-stage chip) 2 shown in step S12 of FIG. 9.

First, alignment of the logic chip 1 and the memory chip 2, is performed. Here, based on the recognition result of the recognition marks 1h of the back surface 1b of the logic chip 1 that has been recognized in the above-described third probe inspection, there is performed alignment of the bumps 1e of the back surface 1b of the logic chip 1 and the bumps 2e of the front surface 2a of the memory chip 2. After alignment is completed, flip-chip mounting of the memory chip 2 is then performed over the logic chip 1 as shown in FIG. 10.

Here, flip-chip mounting is performed by the following: alignment of the bumps 1e of the logic chip 1 and the bumps 2e of the memory chip 2 is performed; and the memory chip 2 is mounted over the logic chip 1 so that the back surface 1b of the logic chip 1 and the front surface 2a of the memory chip 2 face each other. After that, the gap between the logic chip 1 and the memory chip 2 is filled with the under filling 10.

Next, in a resin sealing step, the logic chip 1, the memory chip 2, the copper post bumps 5, the bumps 2e and the like are covered with sealing resin and the sealing body 4 is formed, and furthermore, the ball electrodes 9 serving as the external coupling terminals are mounted. After mounting, the package substrate 3 is separated into individual pieces, and assembly of the BGA 6 shown in FIG. 1 is completed.

Figure 11:
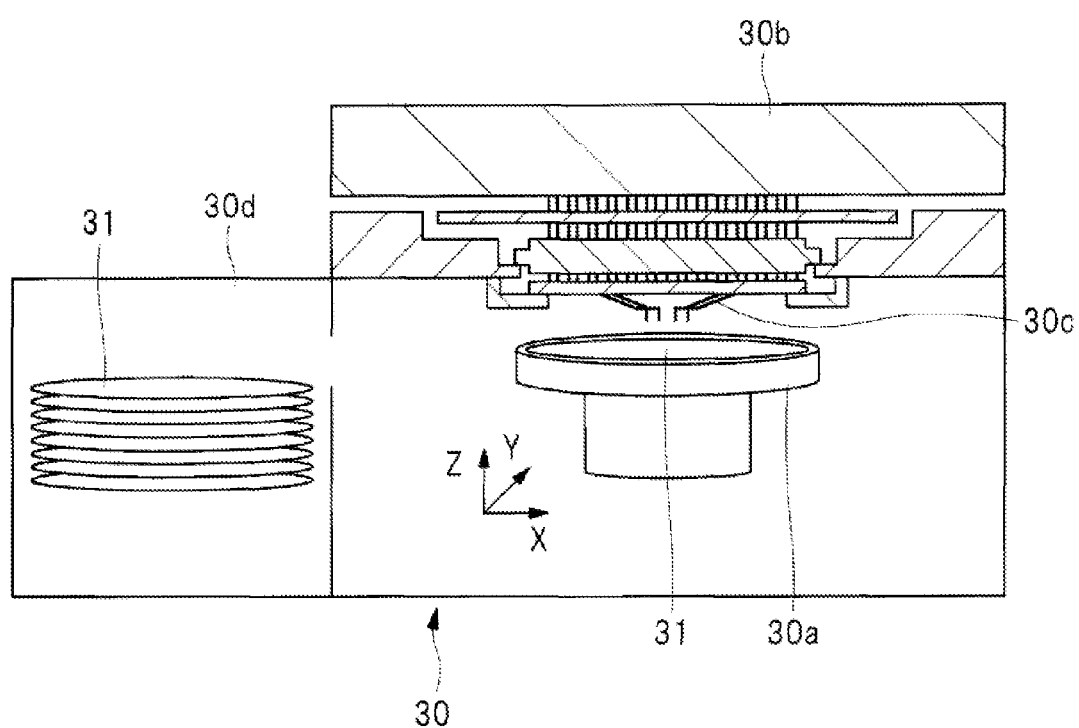
FIG. 11 is a conceptual diagram illustrating one example of a structure of a prober to which comparative examination has been made.
Figure 12:
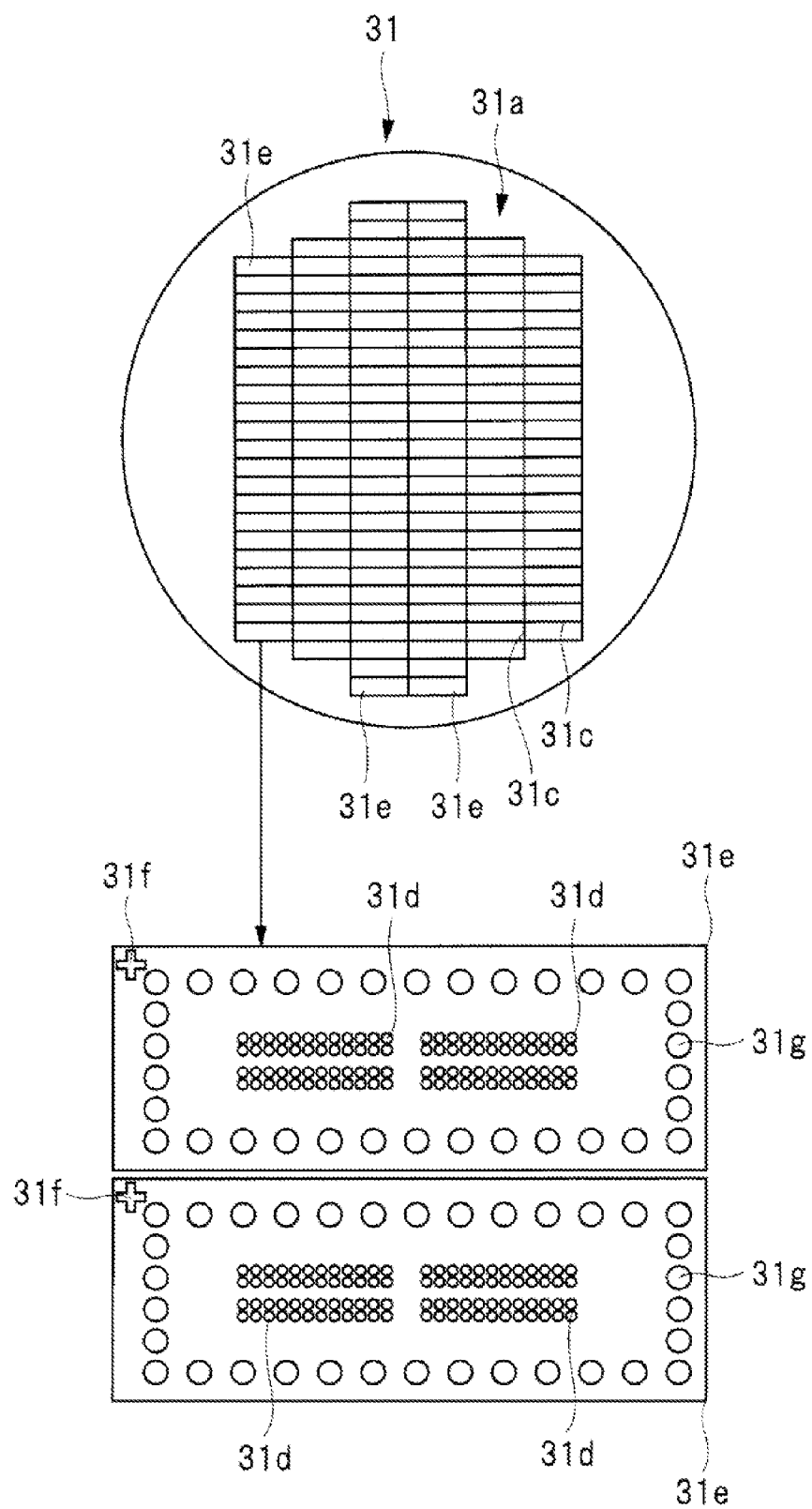
FIG. 12 shows a plan view and an enlarged plan view illustrating a structure of a front surface side of a wafer mounted in the prober of FIG. 11.
Figure 13:
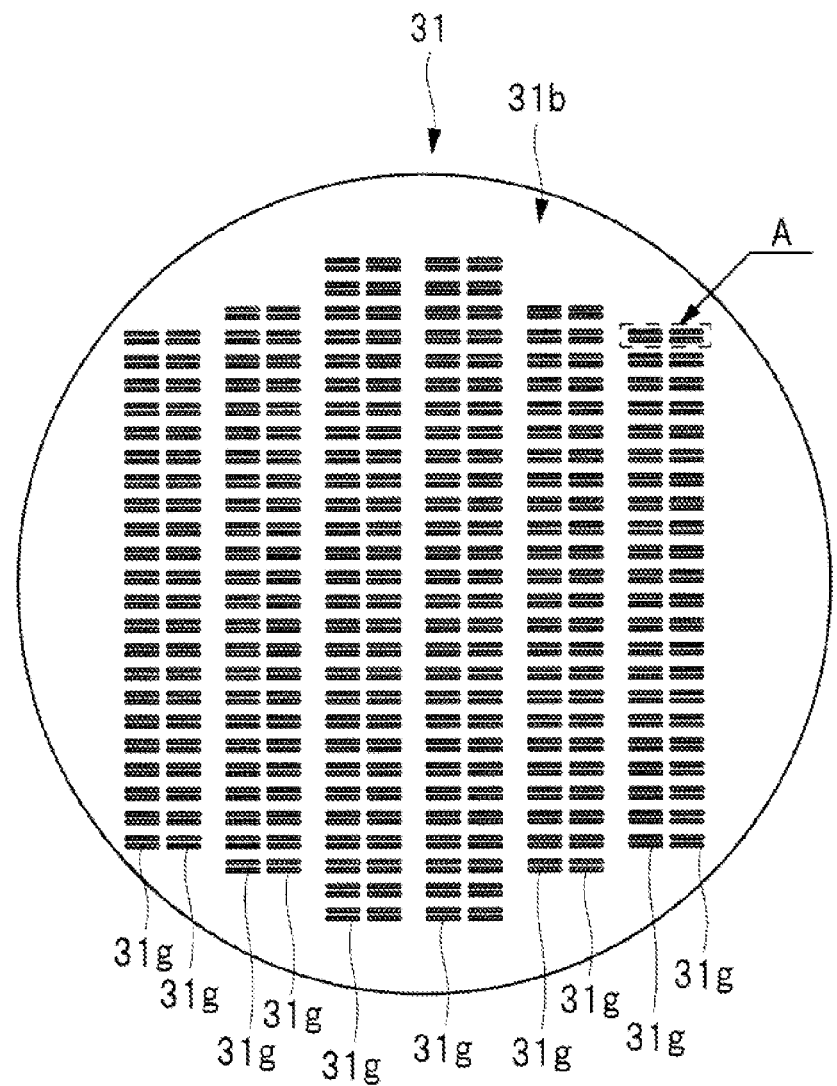
FIG. 13 is a plan view illustrating a structure of a back surface side of the wafer mounted in the prober of FIG. 11.
Figure 14:
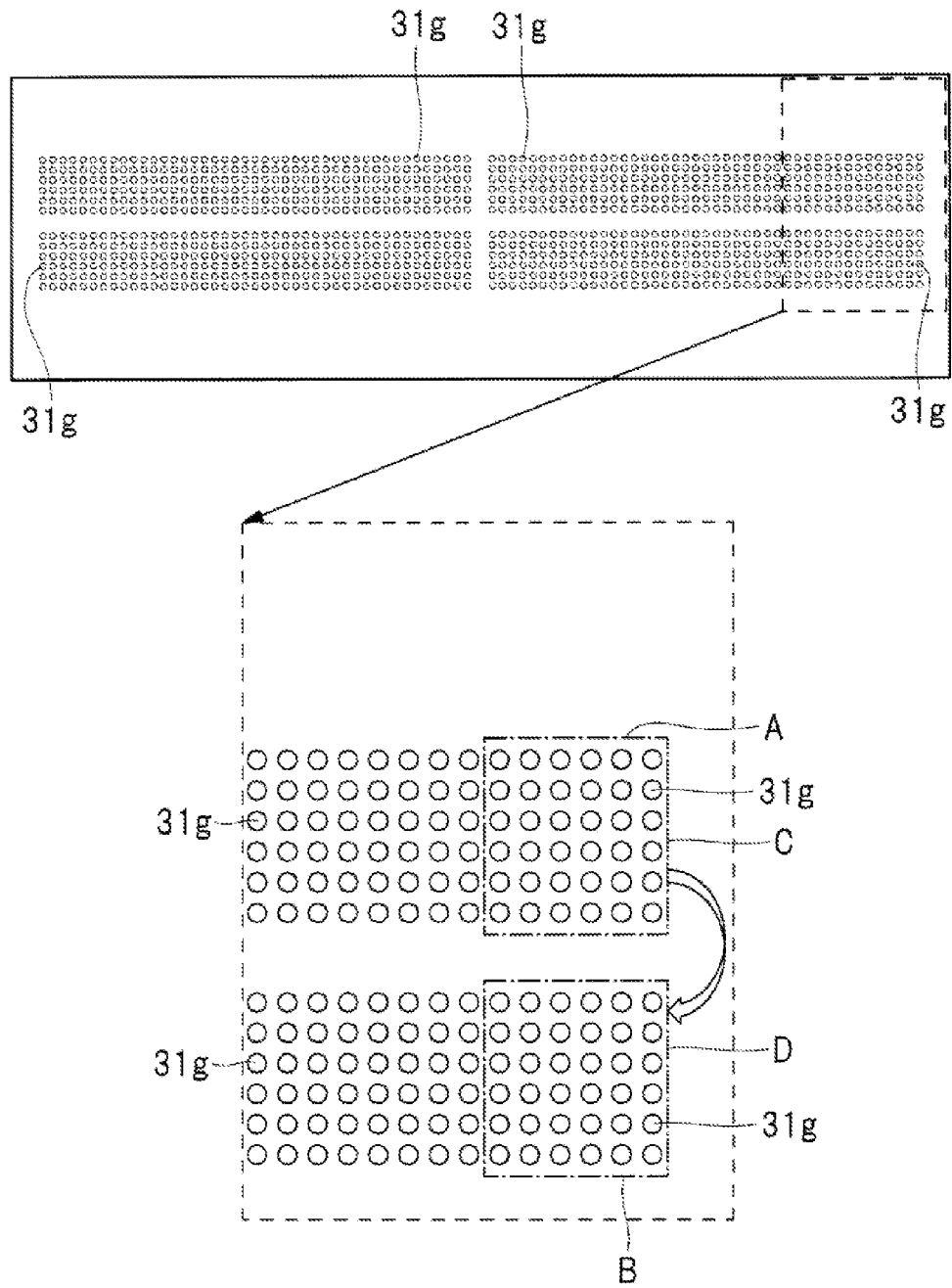
FIG. 14 shows a plan view and a partial enlarged plan view illustrating a structure of an A portion of FIG. 13.
Figure 15:
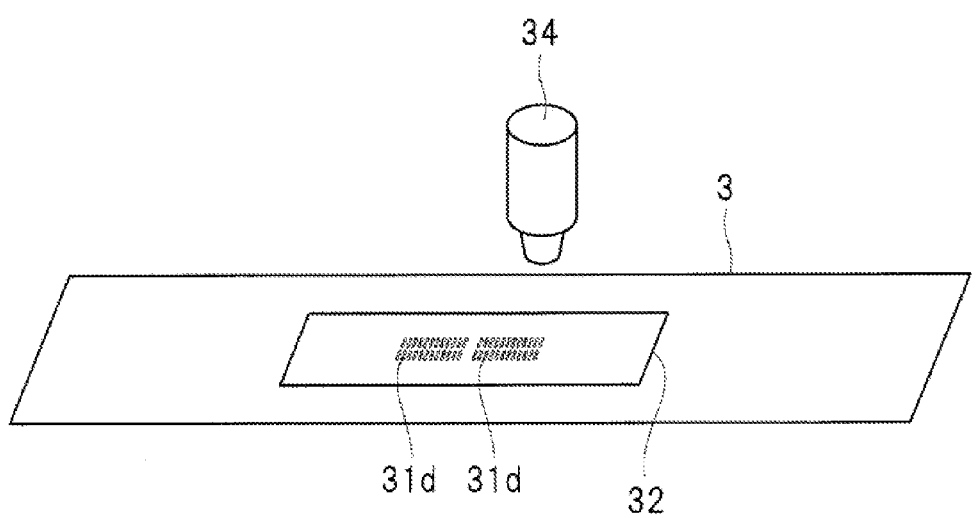
FIG. 15 is a conceptual diagram illustrating an alignment method to which comparative examination has been made.
Figure 16:
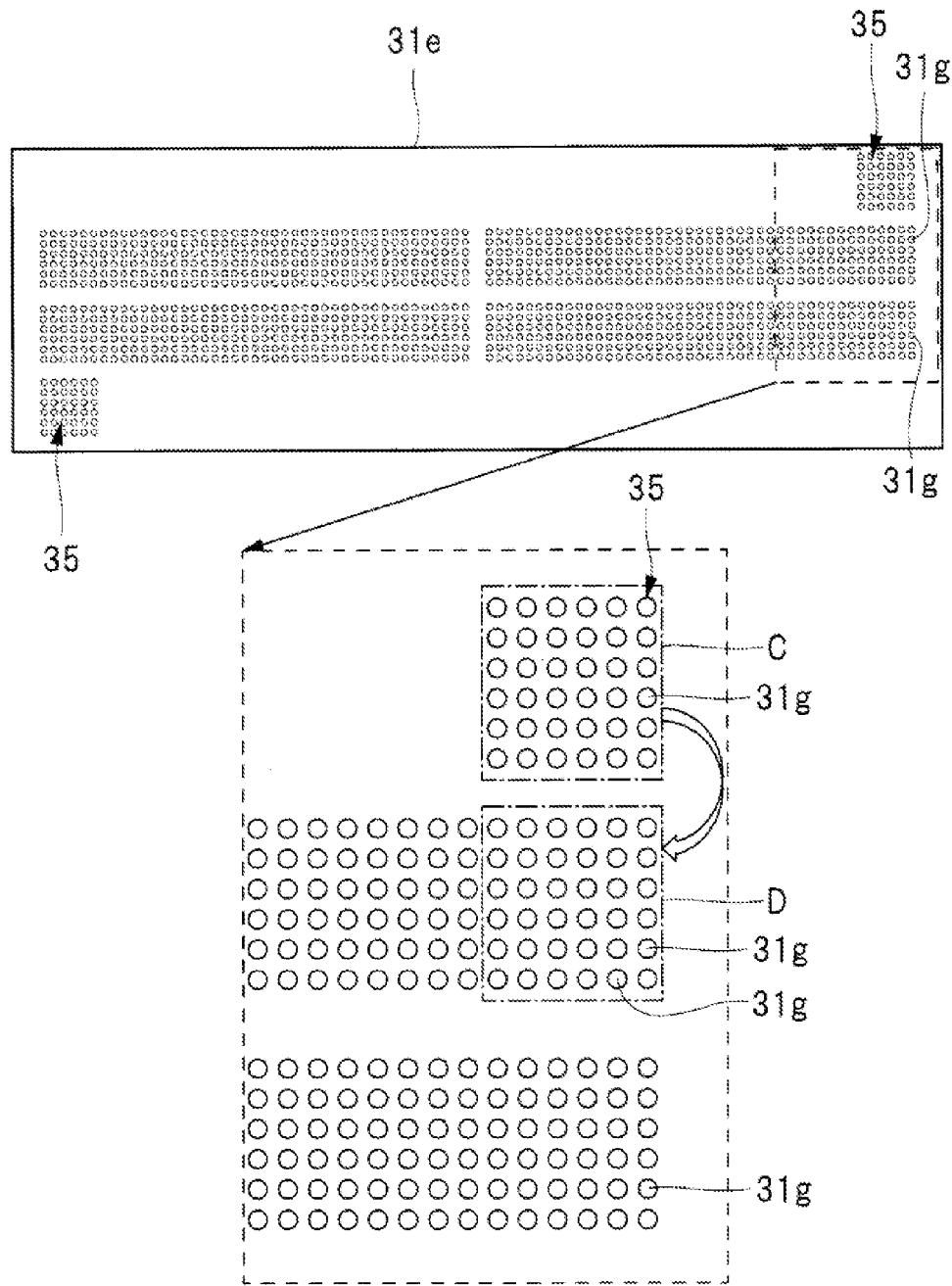
FIG. 16 shows a plan view and an enlarged partial plan view illustrating a recognition range recognized at the time of alignment shown in FIG. 15.

Next, there will be explained an alignment method of a semiconductor wafer performed by the above-described probe inspection of the present embodiment, and an alignment method of a semiconductor chip performed by flip-chip mounting. FIG. 11 is a conceptual diagram illustrating one example of a structure of a prober to which comparative examination has been made, FIG. 12 shows a plan view and an, enlarged plan view illustrating a structure of a front surface side of a wafer mounted in the prober of FIG. 11, FIG. 13 is a plan view illustrating a structure of a back surface side of the wafer mounted in the prober of FIG. 11, and FIG. 14 shows a plan view and a partial enlarged plan view illustrating a structure of an A portion of FIG. 13. In addition, FIG. 15 is a conceptual diagram illustrating an alignment method to which comparative examination has been made, and FIG. 16 shows a plan view and an enlarged partial plan view illustrating a recognition range recognized at the time of alignment shown in FIG. 15.

A prober 30 shown in FIG. 11 is the one to perform the probe inspection of a wafer 31, in which the wafer 31 conveyed to an loader/unloader 30$d$ is ejected to be placed over a stage 30$a$ movable in X, Y, and Z directions, and a plurality of probe needles 30$c$ provided at a test head 30$b$ of the prober 30 is brought into contact with electrodes of the wafer 31, and a conduction inspection, an electrical characteristic inspection, and the like are carried out.

At this time, in the probe inspection, it is necessary to accurately bring the probe needles 30$c$ into contact with test terminals (pads or bumps) provided with each chip, and to inspect characteristics. Therefore, the prober 30 that moves the wafer 31 in the chip unit needs to recognize one chip and to move with high accuracy. Accordingly, the prober 30 can move for one chip by recognizing a specified alignment mark such as a unique pattern in the chip.

FIG. 12 shows the structure of a front surface 31$a$ side of the wafer 31 in which a plurality of through electrodes 31$d$ have been formed, scribe lines 31$c$ are formed on the front surface 31$a$ side other than terminals of the through electrodes 31$d$ shown in the enlarged view, and thus division of the chip can be recognized. In addition, a unique pattern including the above-described terminals or the like is repeated in a chip region 31$e$, the patterns of unique portions are recognized at the time of alignment, and then alignment is performed. In addition to that, alignment marks 31$f$ for alignment are also formed at corners of the chip region 31$e$, and they are used for alignment of the wafer 31 at the time of the above-described probe inspection.

Meanwhile, FIG. 13 shows the structure of the back surface 31$b$ side of the wafer 31, and only a plurality of bumps 31$g$ coupled to the through electrodes 31$d$ is seen. Accordingly, although the marks for alignment are needed in the above-described probe inspection being performed by bringing the probe needles 30$c$ into contact with the bumps 31$g$ of the back surface 31$b$ side in a wafer state, only the bumps 31$g$ are seen on the back surface 31$b$ side as mentioned above, and thus it is difficult to bring the probe needles 30$c$ into contact with the bumps 31$g$ in the above-described probe inspection. For example, when recognition for alignment is performed on the back surface 31$b$ side of the wafer 31 in the prober 30, shapes in a recognition range C and an imaging range D imaged by a camera are the same as each other as shown in the A portion and a B portion of the enlarged view of FIG. 14, and thus there occurs a problem that the shapes are determined to be similar patterns, and that the possibility of false recognition by the prober 30 becomes high.

In addition, this problem occurs also at the time of alignment of a semiconductor chip (for example, the memory chip 2 shown in FIG. 9) of the upper-stage side in chip stacking being performed. For example, when flip-chip mounting of a chip 32 is performed on the wiring substrate 3 shown in FIG. 15 and recognition for alignment of the above-described upper-stage semiconductor chip stacked over the chip 32 is further performed by recognizing the through electrodes 31$d$ by using a camera 34, shapes in the recognition range C and the imaging range D of FIG. 14 are the same as each other as with the time of the above-mentioned probe inspection, and thus there occurs a problem of having a high probability of false recognition.

It should be noted that, as to mounting of the chip 32 of a lower-stage side, since an inter-electrode pitch for flip-chip coupling (it is the pitch between the pads 1$d$ of FIG. 8, and is, for example, approximately not more than 100 μm) is much larger than a pitch (for example, around 50 μm) between the through electrodes 31$d$, it is possible to recognize marks for alignment formed on the wiring substrate 3 and to perform alignment.

However, since flip-chip mounting of the above-described semiconductor chip stacked on the upper-stage side is performed on through electrodes 31$d$ arrayed at a narrow pitch of the lower-stage chip 32, the marks for alignment for securing positional accuracy is needed also at a back surface of the chip 32.

It should be noted that as shown in FIG. 16, even if alignment marks 35 including stipples are formed in the chip region 31$e$, a shape of the recognition range C by the alignment marks 35 and a shape of the imaging range D by the bumps 31$g$ are similar to each other in comparison with an array pattern of the bumps 31$g$, and thus the possibility of false recognition is high.

Next, a feature of the present embodiment will be explained.

Figure 17:
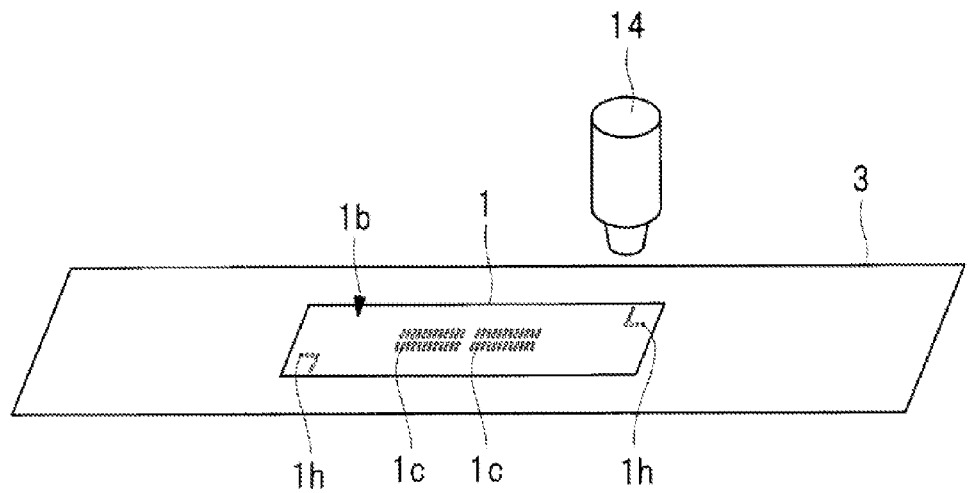
FIG. 17 is a conceptual diagram illustrating one example of a state at the time of alignment in a flip-chip step of the assembly of the semiconductor device of FIG. 1.
Figure 18:
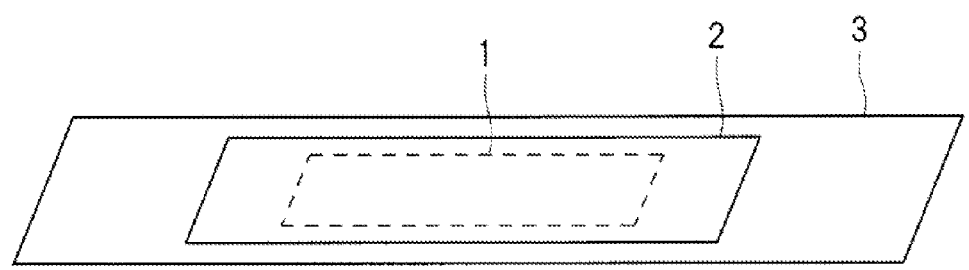
FIG. 18 is a conceptual diagram illustrating one example of a structure of the semiconductor device of FIG. 1 after flip-chip mounting in the flip-chip step of the assembly thereof.
Figure 19:
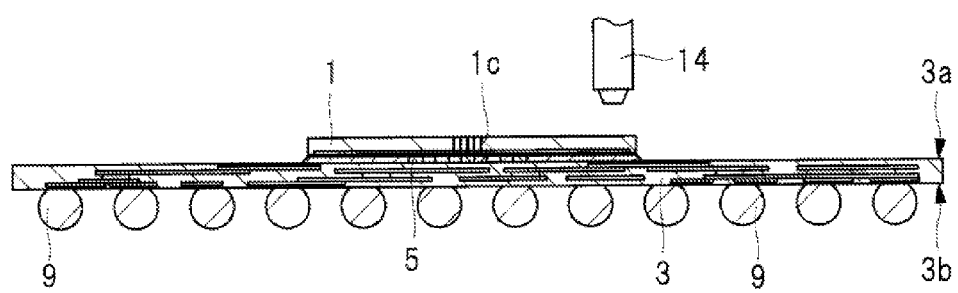
FIG. 19 is a cross-sectional view illustrating one example of a structure at the time of the alignment of FIG. 17.
Figure 20:
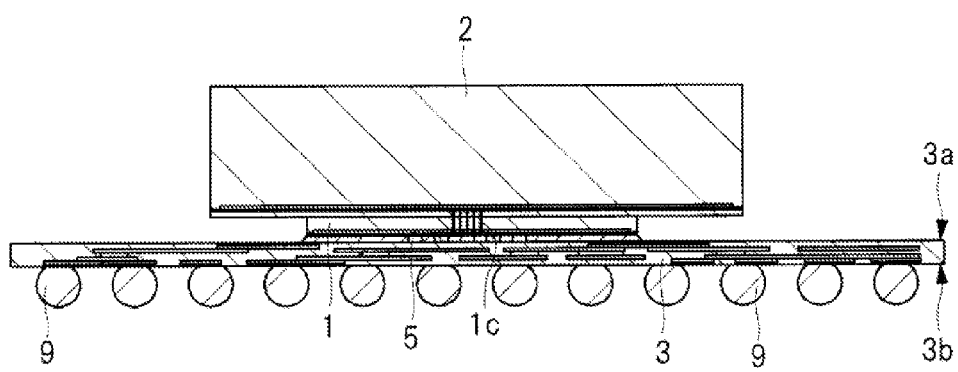
FIG. 20 is a cross-sectional view illustrating one example of a structure after the flip-chip mounting shown in FIG. 18.
Figure 21:
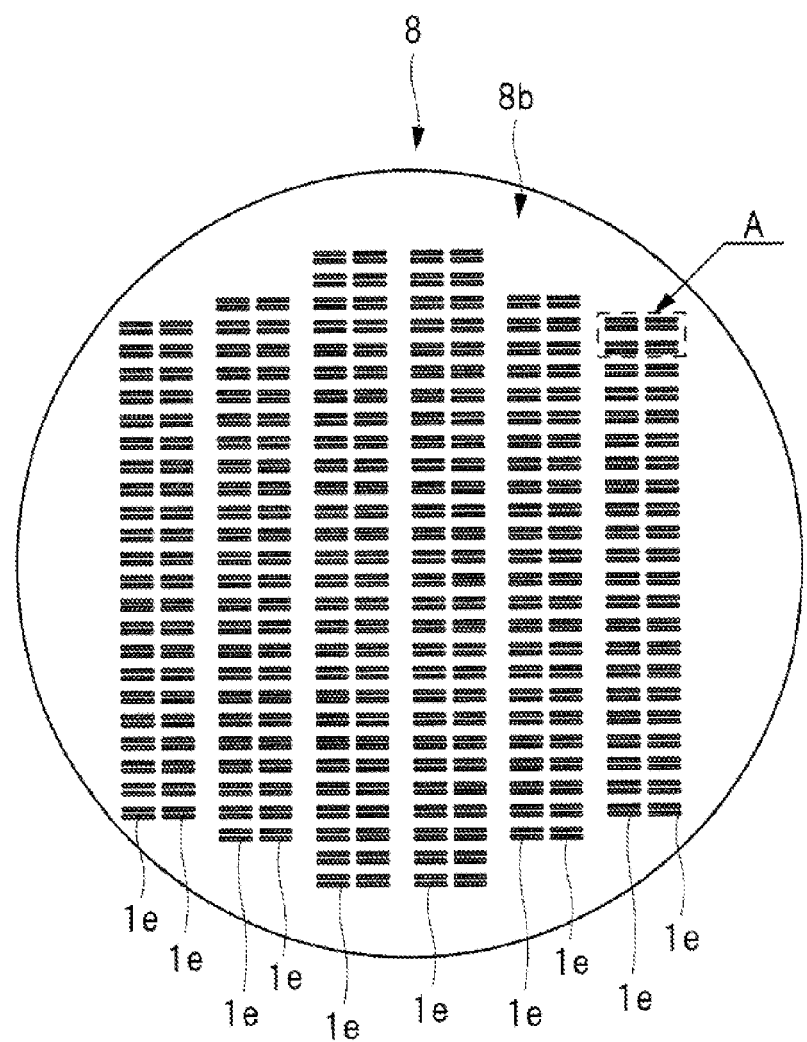
FIG. 21 is a plan view illustrating a structure of a front surface side of a wafer used in the present embodiment.
Figure 22:
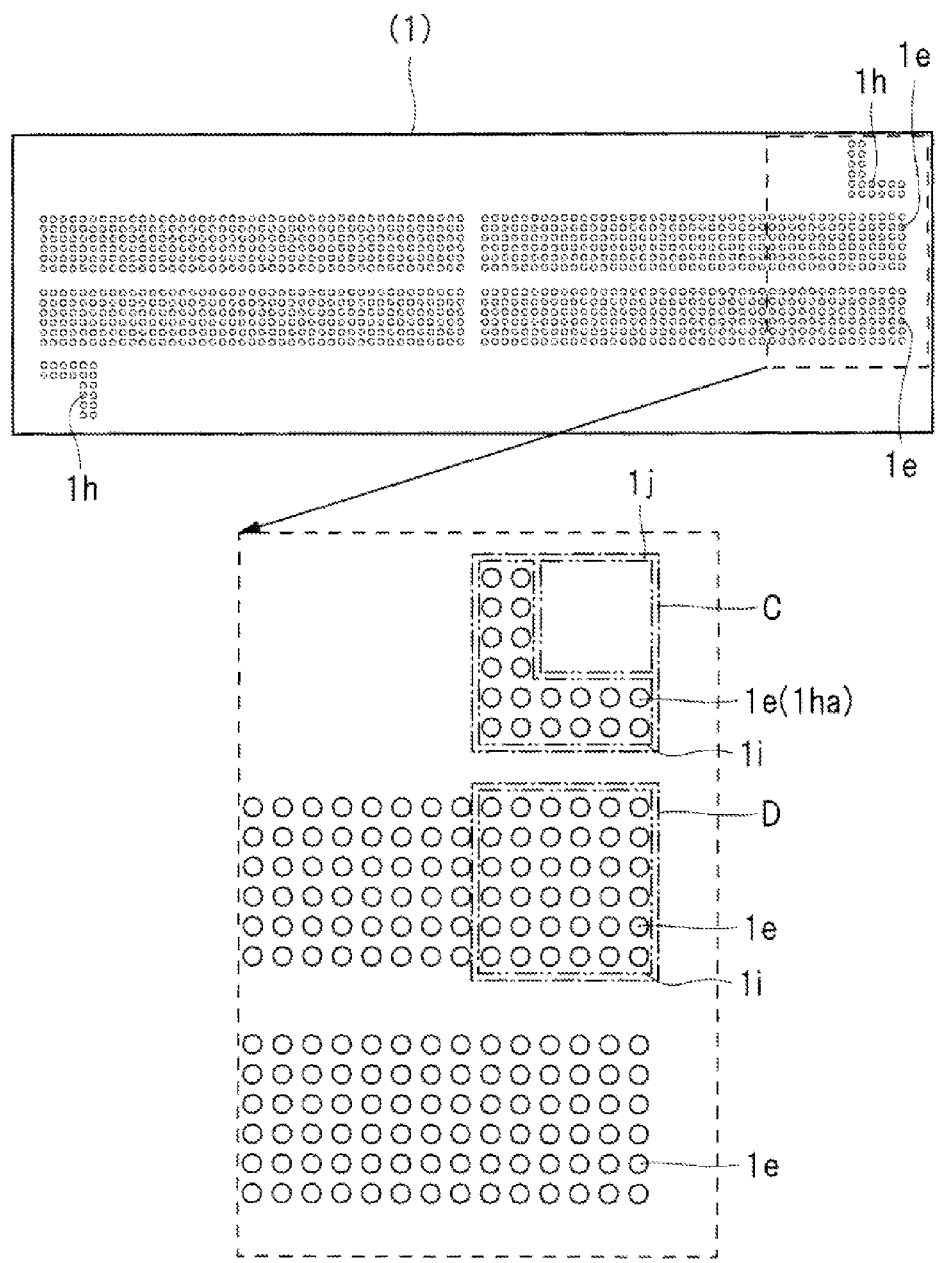
FIG. 22 shows a plan view and a partial enlarged plan view illustrating a structure of an A portion of FIG. 21.
Figure 23:
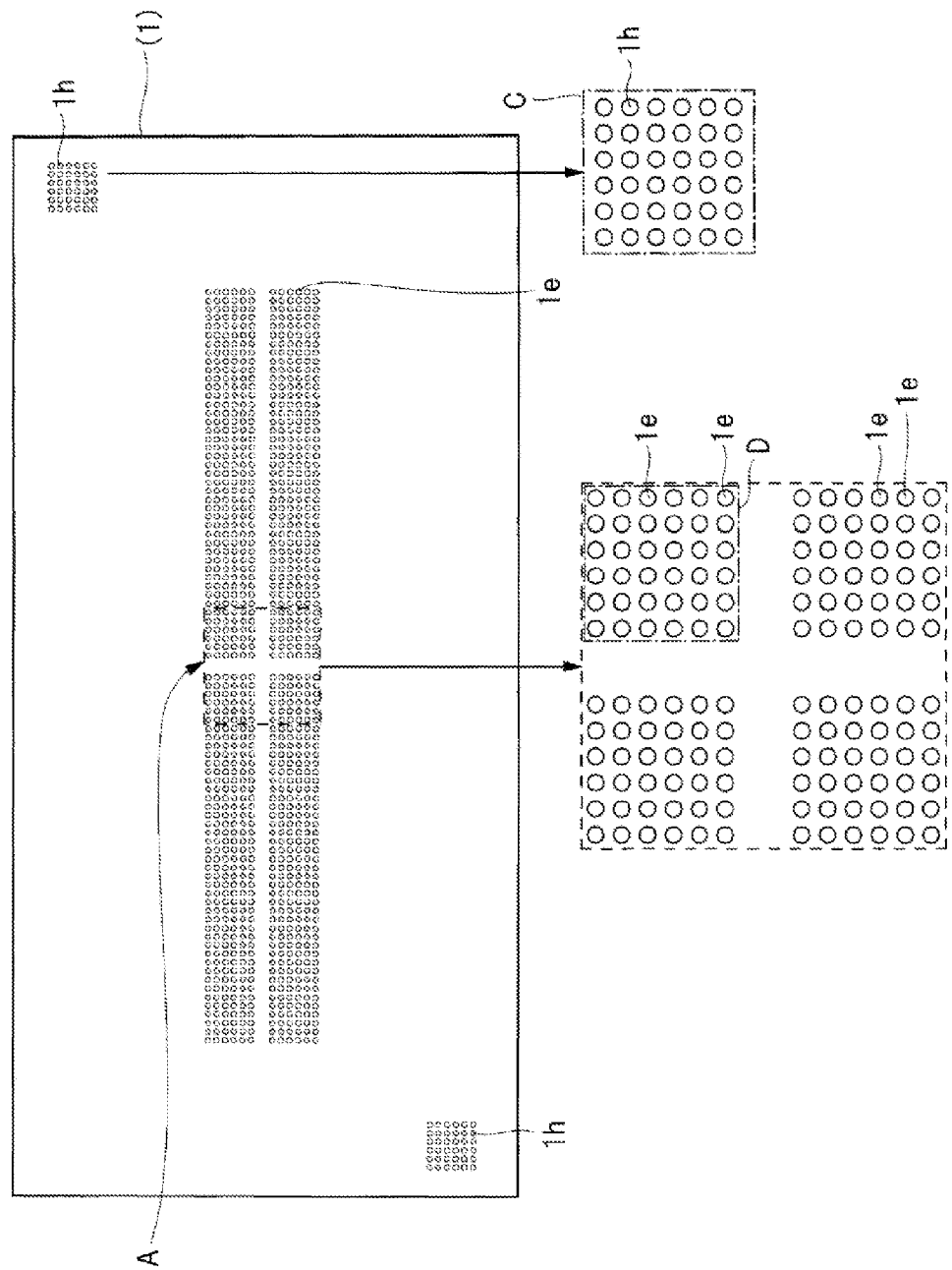
FIG. 23 shows a plan view of a semiconductor chip to which comparative examination has been made and partial enlarged plan views of patterns.
Figure 24:
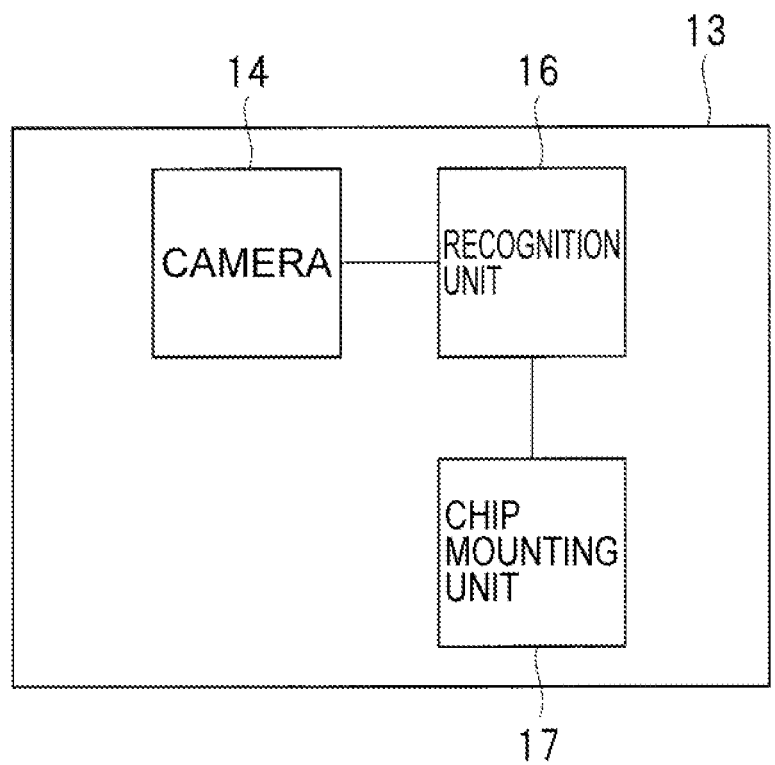
FIG. 24 is a block diagram illustrating one example of a structure of a chip mounting machine used in the flip-chip step of the assembly of the semiconductor device of FIG. 1.
Figure 25:
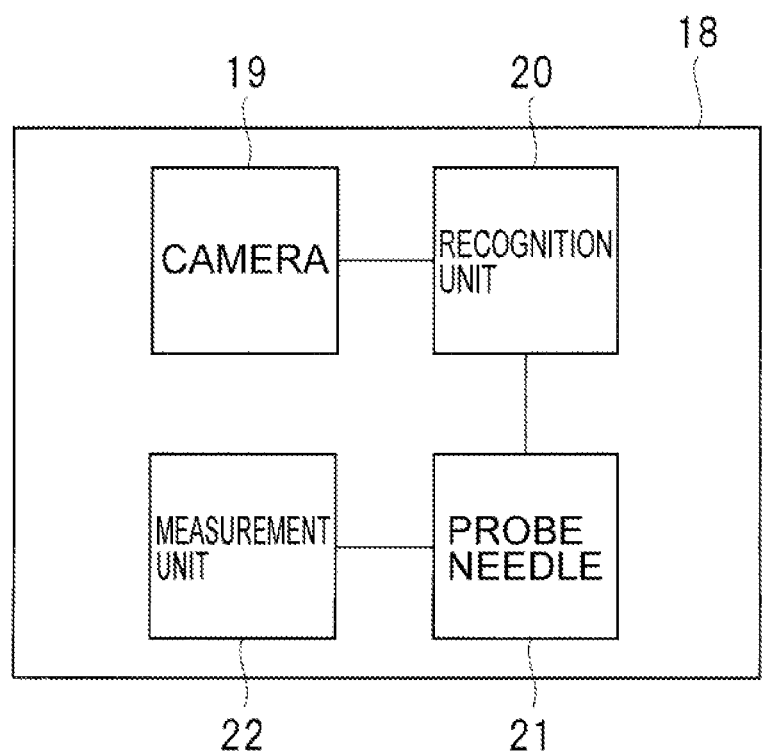
FIG. 25 is a block diagram illustrating one example of a structure of a prober apparatus used in an inspection step of the assembly of the semiconductor device of FIG. 1.
Figure 26:
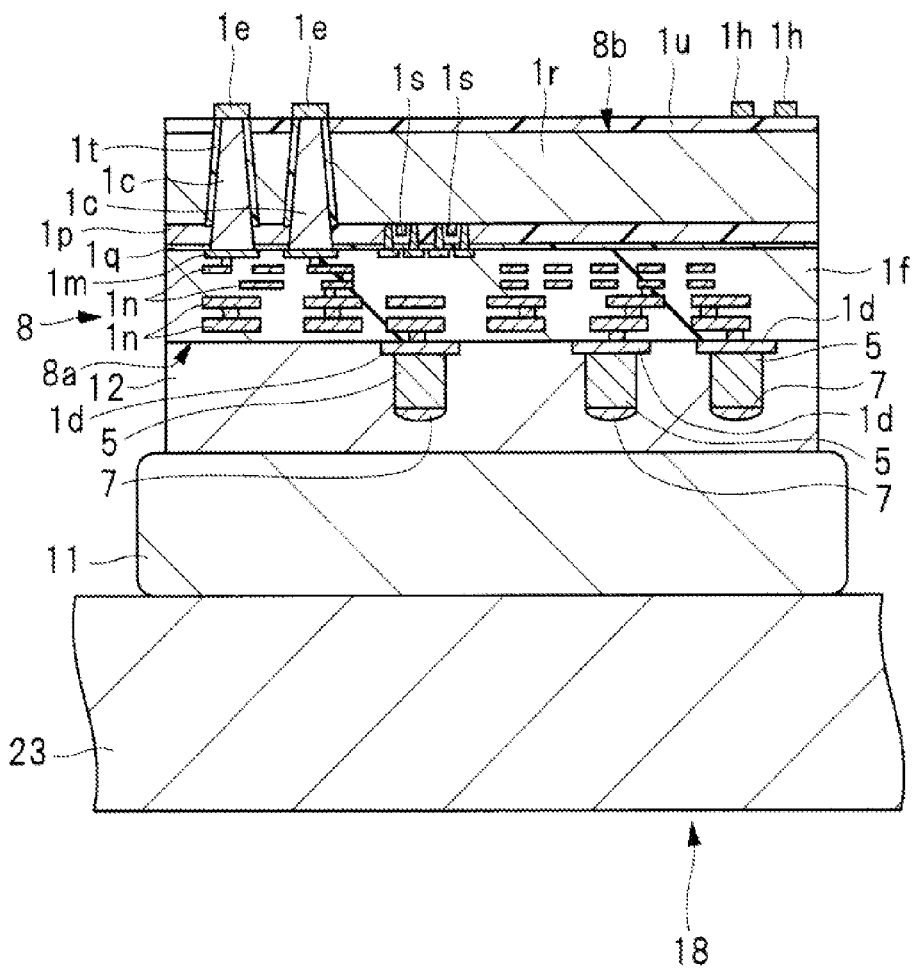
FIG. 26 is a partial cross-sectional view illustrating one example of a holding state of the wafer at the time of inspection in the prober apparatus of FIG. 25.

FIG. 17 is a conceptual diagram illustrating one example of a state at the time of alignment in a flip-chip step of the assembly of the semiconductor device of FIG. 1, FIG. 18 is a conceptual diagram illustrating one example of a structure of the semiconductor device of FIG. 1 after flip-chip mounting in the flip-chip step of the assembly thereof, FIG. 19 is a cross-sectional view illustrating one example of a structure at the time of alignment of FIG. 17, and FIG. 20 is a cross-sectional view illustrating one example of a structure after the flip-chip mounting shown in FIG. 18. In addition, FIG. 21 is a plan view illustrating a structure of a front surface side of a wafer used in the present embodiment, FIG. 22 shows a plan view and a partial enlarged plan view illustrating a structure of an A portion of FIG. 21, and FIG. 23 shows a plan view and a partial enlarged plan view illustrating a structure of the A portion of FIG. 21. Furthermore, FIG. 24 is a block diagram illustrating one example of a structure of a chip mounting machine used in the flip-chip step of the assembly of the semiconductor device of FIG. 1, FIG. 25 is a block diagram illustrating one example of a structure of a prober apparatus used in an inspection step of the assembly of the semiconductor device of FIG. 1, and FIG. 26 is a partial cross-sectional view illustrating one example of a holding state of the wafer at the time of inspection in the prober apparatus of FIG. 25.

In the present embodiment, recognition marks 1$h$ for alignment are formed on the back surface 1$b$ of the logic chip 1 as shown in FIGS. 17 and 18. Additionally, when flip-chip mounting of the memory chip 2 is performed over the back surface 1b of the logic chip 1, a shape in a recognition range including the recognition marks 1h is recognized, and alignment of the memory chip 2 is performed.

As described above, the recognition marks 1h for alignment are provided on the back surface 1b of the logic chip 1, and thus false recognition can be more reduced than a case of recognizing a part of the through electrodes 1c Furthermore, as shown in FIGS. 19 and 20, when the memory chip 2 is mounted over the logic chip 1, alignment of the through electrodes 1c of the logic chip 1 and the bumps 2e of the memory chip 2 can be performed with high accuracy. Here, FIG. 21 shows the back surface 8b side of the wafer 8 in which the recognition marks 1h as shown in FIG. 22 have been formed, and in each chip region of the back surface 8b side, the bumps 1e are provided, respectively, and the recognition marks 1h are formed at chip corners as shown in FIG. 22.

It should be noted that the recognition marks 1h shown in FIG. 22 are stipples by the bump 1e coupled to each of the through electrodes 1c, and that they look like what is called an L shape when viewed from above.

As a result, in a flip-chip coupling step, first, the recognition range C including the recognition mark 1h over the back surface 1b of the logic chip 1 is imaged by the camera 14 shown in FIG. 19, and the shape of the recognition range C shown in FIG. 22 is recognized.

Here, the shape of the recognition range C is different from any portion of the array shape of the bumps 1e. Namely, on the back surface 1b side of the logic chip 1, the shape of the recognition range C to be imaged by the camera 14 and to be recognized is not the same as the array shape in the imaging range D in an array of the bumps 1e.

It should be noted that "the shape is different" means that the shape of the recognition range. C including the recognition mark 1h is different from any portion of the array shape of the bumps 1e of the back surface 1b of the logic chip 1. Alternatively, it means that, when the shape of the recognition range C including the recognition mark 1h is overlapped with a region where the bumps 1e have been arrayed, the respective shapes do not coincide with each other (coincidence does not occur).

In an example shown in FIG. 22, the recognition mark 1h includes an aggregate of a plurality of patterns 1ha and furthermore, the recognition range C including the recognition mark 1h has a first region 1i where the patterns 1ha have been arrayed, and a second region 1j where the pattern 1ha has not been arranged.

Meanwhile, the imaging range D has only a region (corresponding to the first region 1i) where the bumps 1e have been arranged, and does not have a region corresponding to the above-described second region 1j.

Accordingly, a shape of the recognition range C and an array shape of the imaging range D that have been formed over the chip are definitely different from each other, and both are not similar patterns (similar shapes).

Accordingly, when the camera 14 images the back surface 1b of the logic chip 1, false recognition of the array shape of the imaging range D as the shape of the recognition range C to be recognized, can be reduced.

In addition, in a recognition unit of a chip mounting machine or the like, when a mark of a predetermined location is recognized, an approximate recognition position (a design value) is stored in the device, and operation to look for the mark is performed by setting a coordinate (X, Y) of the mark in many cases. However, when a similar pattern is formed around the coordinate, the recognition unit may falsely recognize this similar pattern as the mark. Accordingly, the similar pattern and a recognition pattern are preferably arranged as far as possible.

Here, FIG. 23 shows one solution of the problem (when a shape of an alignment mark approximates to an array shape of a plurality of electrode pads, false recognition occurs at the time of recognition) of the invention in the present application. The A portion of FIG. 23 is a case where there is imaged a vicinity of a center of an array of the bumps 1e, which is likely to be comparatively falsely recognized, and since an array shape of the bumps 1e of the imaging range D and an array of the recognition marks 1h of the recognition range C approximate to each other, the possibility of false recognition is high.

Accordingly, positions of the bumps 1e and the recognition marks 1h can be arranged away from each other by arrangement of the recognition marks 1h at the corners of the back surface of the semiconductor chip, and as a result, false recognition can be prevented.

However, arrangement of the recognition marks 1h at the positions away from the bumps 1e causes the increase of an area of the semiconductor chip.

Consequently, the shape of the recognition marks 1h of the recognition range C is set to be a shape definitely different from the array shape of the imaging range D like in the invention in the present application shown in FIG. 22, whereby the recognition marks 1h can be arranged close to the bumps 1e, and as a result, the area of the semiconductor chip can be reduced. Furthermore, there can be suppressed increase in size (increase in wafer size) of the semiconductor wafer where a semiconductor chip is formed.

Next, there will be explained a detailed method in flip-chip coupling of the memory chip 2 being performed over the logic chip 1 where the recognition marks 1h shown in FIG. 22 have been formed.

First of all, there will be explained a chip mounting machine 13 shown in FIG. 24 used in flip-chip coupling. The chip mounting machine 13 has: the camera 14 that images the shape of the recognition range C including the recognition marks 1h of the logic chip 1 shown in FIG. 22; a recognition unit 16 that stores image data imaged by the camera 14 and that processes the above-described image data; and a chip mounting unit 17 that positions and mounts the memory chip 2 of the upper-stage side on the basis of the above-described image data which the recognition unit 16 has processed.

At the time of flip-chip coupling, first, the recognition range C including the recognition marks 1h on the back surface 1b of the logic chip 1 of FIG. 22 is imaged by the camera 14 of the chip mounting machine 13, and the shape of the recognition range C is recognized. At this time, a comparison is made between each other are image data of the shape of the recognition range C previously stored in the recognition unit 16, and image data of the shape of the recognition range C newly imaged by the camera 14. In that case, as to the shape of the recognition range C and the array shape of the imaging range D of the bumps 1e, the shape of the recognition range C differs from any portion of the above-described array shape, and thus the array shape of the imaging range D is not falsely recognized as the shape of the recognition range C to be recognized, and the shape of the recognition range C can be reliably recognized by the recognition unit 16.

Next, alignment of the bumps 1e of the logic chip 1 and the bumps 2e of the memory chip 2, which are projection electrodes, is performed by the chip mounting unit 17 on the basis of a result of having recognized the shape of the recognition range C, as shown in FIG. 9.

Furthermore, after the above-described alignment, the memory chip 2 is mounted over the logic chip 1 by the chip mounting unit 17, and the bumps 1e of the logic chip 1 and the bumps 2e of the memory chip 2 are electrically coupled to one another. As a result of this, flip-chip coupling is completed.

As described above, the recognition marks 1h that form the shape different from the array shape of the bumps 1e are formed on the back surface 1b of the logic chip 1, whereby the recognition marks 1h in the shape of the recognition range C can be reliably recognized, and alignment of the bumps 1e of the logic chip 1 and the bumps 2e of the memory chip 2 can be performed with high accuracy.

As a result of it, reliability of flip-chip coupling can be enhanced, and assemblability of the semiconductor device (BGA 6) can be improved.

Next, there will be explained a detailed method that performs alignment of the logic chip 1 (semiconductor wafer 8) where the recognition marks 1h shown in FIG. 22 have been formed and probe needles at the time of the probe inspection (the second probe inspection or the third probe inspection) in an assembly step of the BGA 6 of the present embodiment.

First of all, there will be explained a prober apparatus shown in FIG. 25 used in the above-described probe inspection. The prober apparatus 18 has: a camera 19 that images the shape of the recognition range C including the recognition marks 1h; a recognition unit 20 that stores image data imaged by the camera 19 and that processes the above-described image data; a plurality of probe needles 21 that makes contact with a semiconductor chip based on the above-described image data that the recognition unit 20 has processed; and a measurement unit 22 that measures electrical characteristics of the above-described semiconductor chip the rough the probe needles 21.

At the time of the probe inspection, first, the recognition range C including the recognition marks 1h on the back surface 1b of the logic chip 1 of FIG. 22 is imaged by the camera 19 of the prober apparatus 18, and the shape of the recognition range C is recognized. At this time, compared with each other are image data of the shape of the recognition range C previously stored in the recognition unit 20, and image data of the shape of the recognition range C newly imaged by the camera 19. In that case, since, as to the shape of the recognition range C and the array shape of the imaging range D of the bumps 1e, the shape of the recognition range C differs from any portion of the above-described array shape, the array shape of the imaging range D is not falsely recognized as the shape of the recognition range C to be recognized, and the shape of the recognition range C can be reliably recognized by the recognition unit 20.

After that, on the basis of a result of having recognized the shape of the recognition range C, there is performed alignment of the bumps 1e of the logic chip 1 shown in FIG. 9 (or the bumps 1e of the back surface 8b of the wafer 8 of FIG. 5), and the probe needles 21 of FIG. 25.

After the above-described alignment, the probe needles 21 are brought into contact with the respective the bumps 1e of the logic chip 1, and electrical characteristics of the logic chip 1 are further measured by the measurement unit 22.

As described above, the recognition marks 1h that form the shape different from the array shape of the bumps 1e are formed on the back surface 1b of the logic chip 1, whereby the recognition marks 1h in the shape of the recognition range C can be reliably recognized, and alignment of the bumps 1e of the logic chip 1 and the probe needles 21 of the prober apparatus 18 can be performed with high accuracy.

As a result, reliability of the inspection in the probe inspection can be enhanced, and assemblability of the semiconductor device (BGA 6) can be improved.

It should be noted that, when the second probe inspection is performed after the bumps 1e are formed in a back surface bump formation step of step S7 shown in FIG. 5, the probe inspection is performed in a state where the wafer 8 is applied to the carrier 11. The probe inspection in this wafer state is, as shown in FIG. 26, performed in a state of holding the wafer 8 over a stage 23 of the prober apparatus 18 via the carrier 11.

When the probe inspection is carried out in this wafer state, the wafer 8 is diced as shown in FIG. 7 after the probe inspection, the logic chip 1 determined to be good by the above-described probe inspection (the second probe inspection) is obtained and after that, the good logic chip 1 is mounted on the package substrate 3 as shown in FIG. 8.

It should be noted that the above-described second and third probe inspections need not be necessarily carried out in the assembly of the BGA 6 of the present embodiment. In addition, any one of the above-described second and third probe inspections may be carried out, or both of them may be carried out.

In addition, also in the flip-chip coupling of the memory chip 2 of the upper-stage side shown in FIG. 9, alignment performed by imaging the recognition marks 1h need snot be necessarily carried out. However, in that case, alignment with the probe needles 21 performed by imaging the recognition marks 1h is performed in at least any one of the above-described second and third probe inspections.

In addition, the shape of the recognition range including the recognition marks 1h imaged in the above-described first and second probe inspections may just be in common with the shape of the recognition range C including the recognition marks 1h imaged in the flip-chip coupling of the memory chip 2 of the upper-stage side shown in FIG. 9. Namely, the recognition marks 1h imaged for alignment in the probe inspection and flip-chip coupling may just be used in common.

As a result, there can be avoided the formation of different recognition marks 1h on the back surface of the chip for every step, and a region in the semiconductor chip can be efficiently used.

Next, a formation method of the recognition marks 1h of the present embodiment will be explained.

Figure 27:
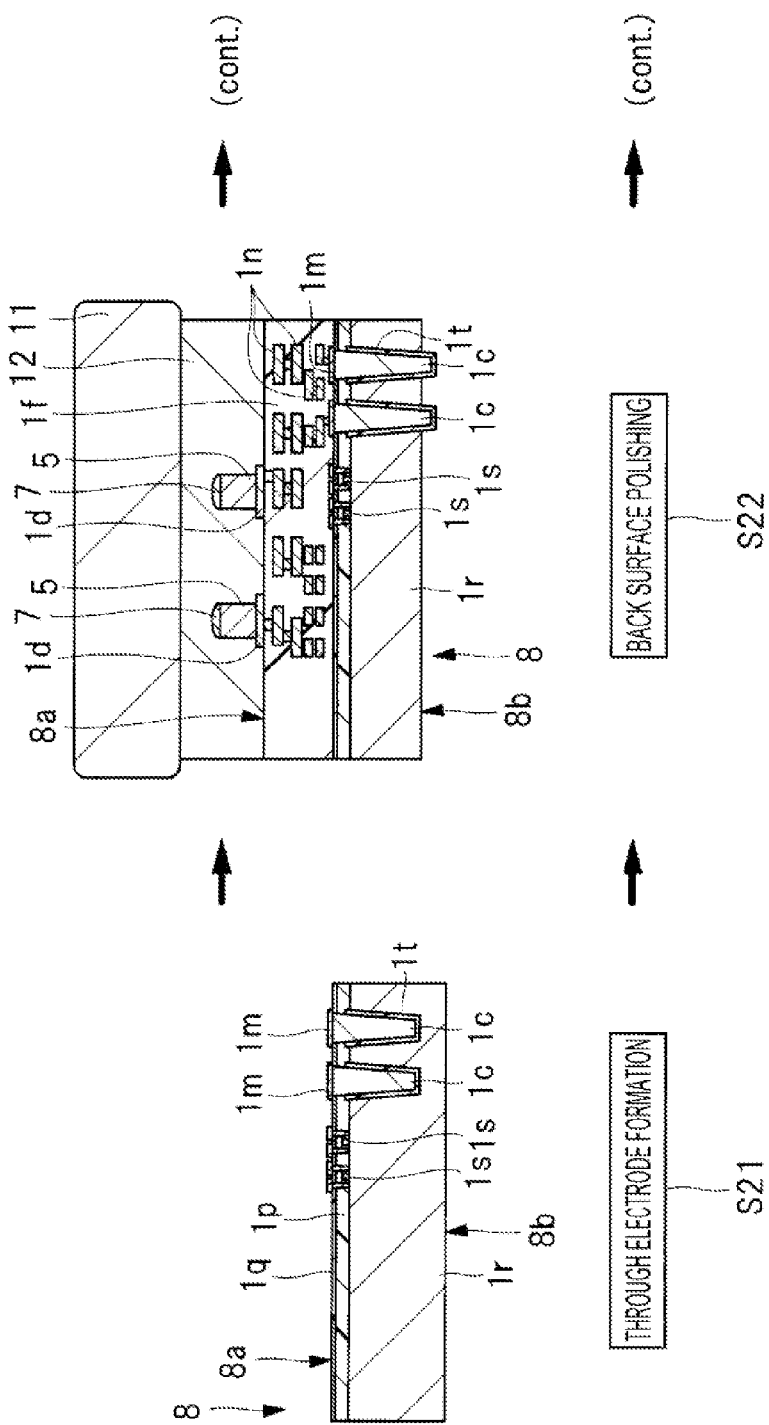
FIG. 27 shows cross-sectional views illustrating one example of a recognition mark formation step in a semiconductor chip incorporated in the semiconductor device of FIG. 1.
Figure 28:
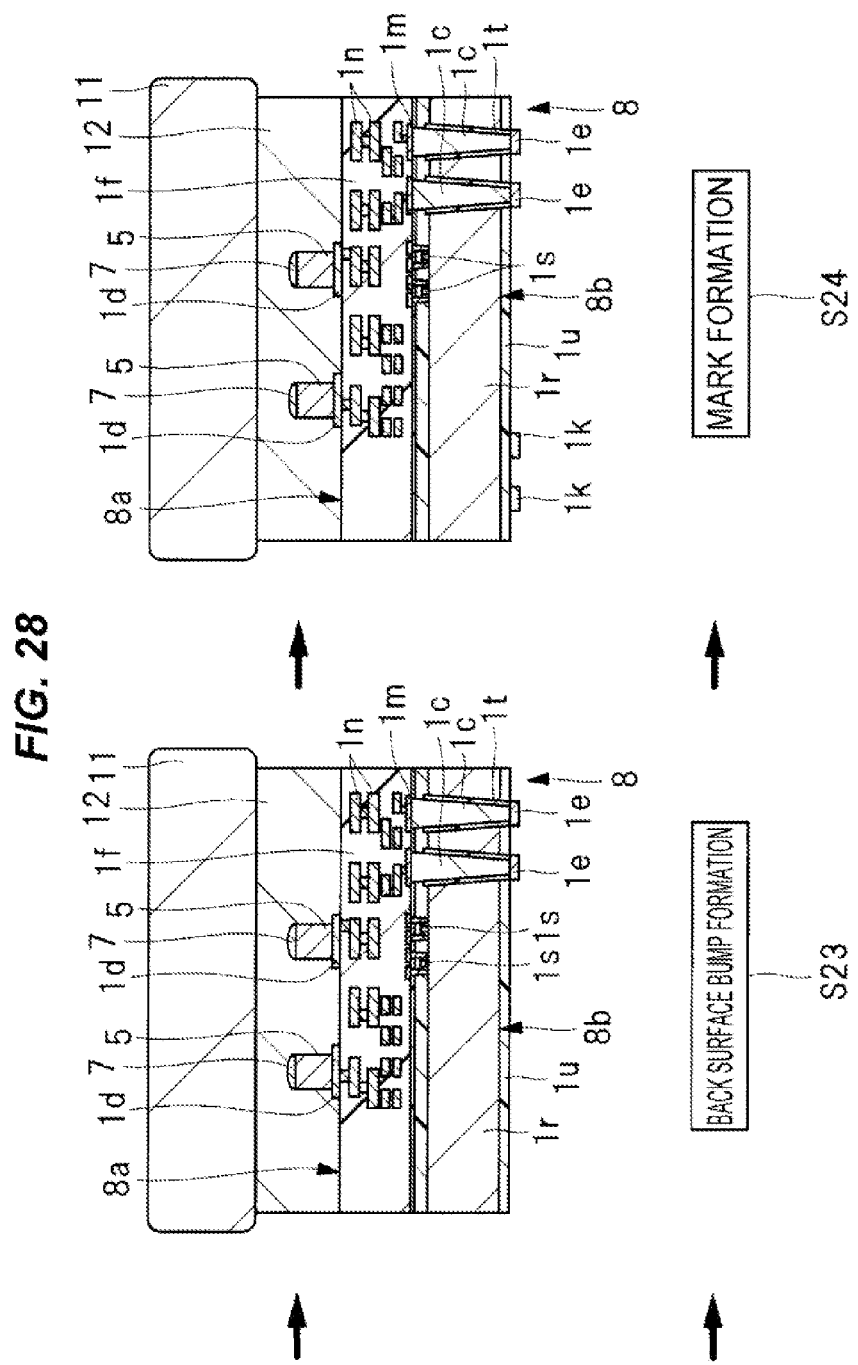
FIG. 28 shows cross-sectional views illustrating one example of the recognition mark formation step in the semiconductor chip incorporated in the semiconductor device of FIG. 1.
Figure 29:
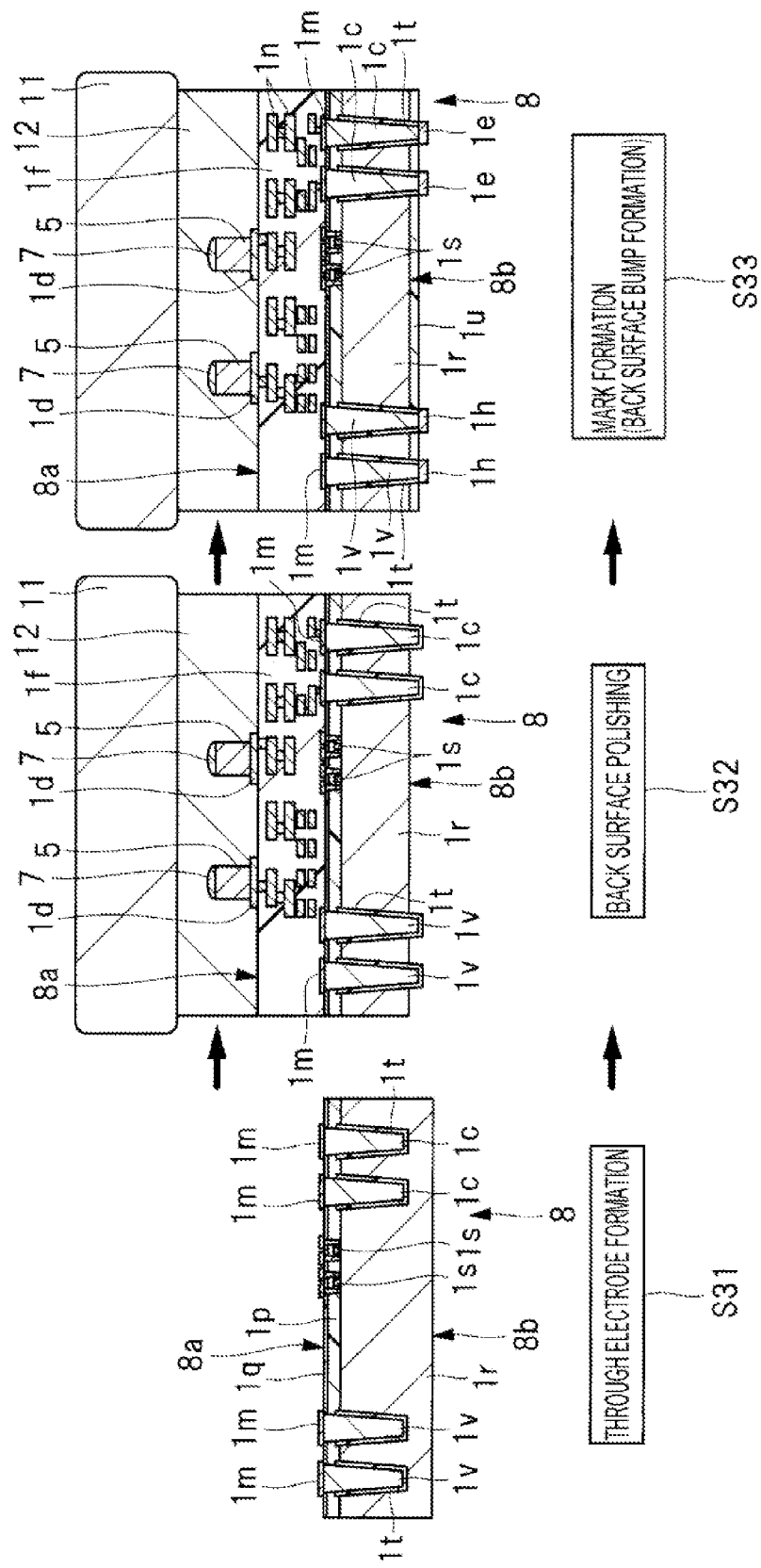
FIG. 29 shows cross-sectional views illustrating a first modification of the recognition mark formation step in the semiconductor chip incorporated in the semiconductor device of FIG. 1.

FIG. 27 shows cross-sectional views illustrating one example of a recognition mark formation step in a semiconductor chip incorporated in the semiconductor device of FIG. 1, FIG. 28 shows cross-sectional views illustrating one example of the recognition mark formation step in the semiconductor chip incorporated in the semiconductor device of FIG. 1, and FIG. 29 shows cross-sectional views illustrating a first modification of the recognition mark formation step in the semiconductor chip incorporated in the semiconductor device of FIG. 1.

Figure 30:
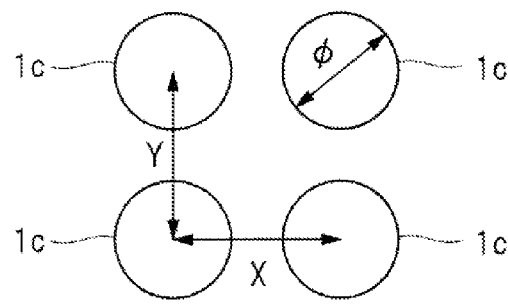
FIG. 30 is a conceptual diagram illustrating one example of pitches and a size of the patterns by through electrodes of FIG. 22.
Figure 31:
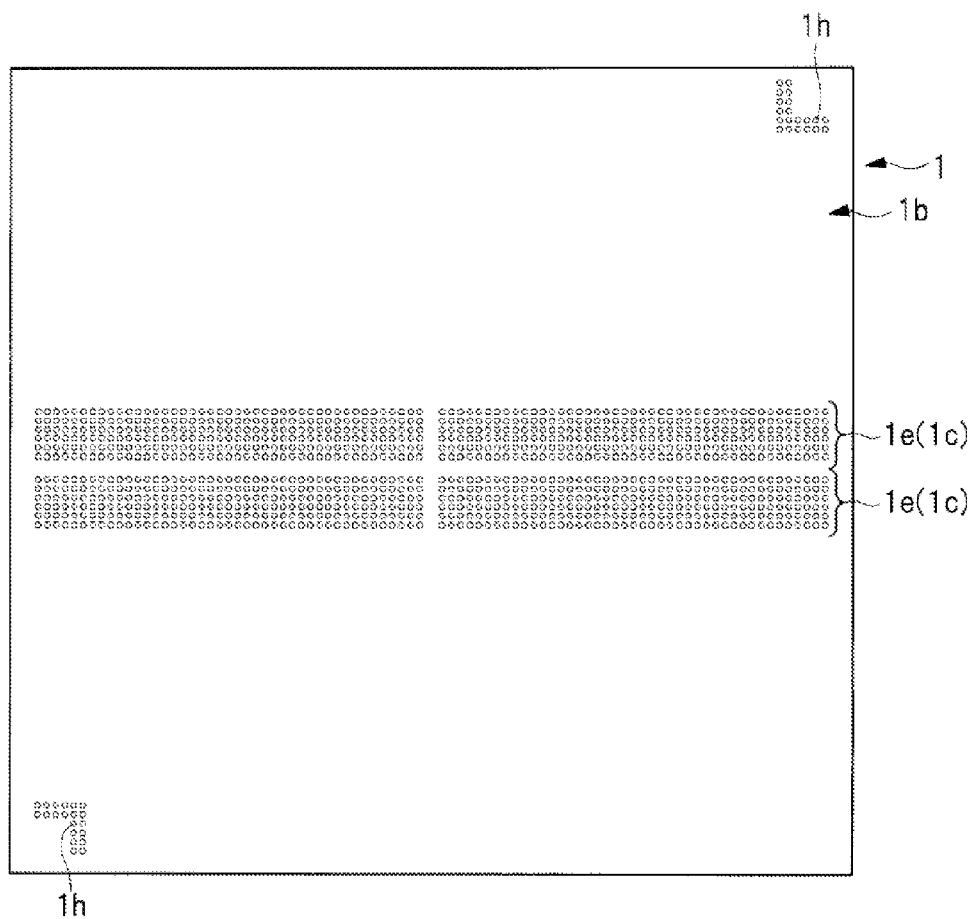
FIG. 31 is a plan view illustrating one example of a structure of a back surface side of a logic chip incorporated in the semiconductor device of FIG. 1.

Furthermore, FIG. 30 is a conceptual diagram illustrating one example of pitches and a size of the patterns by the through electrodes of FIG. 22, and FIG. 31 is a plan view illustrating one example of a structure of a back surface side of a logic chip incorporated in the semiconductor device of FIG. 1.

First of all, a case will be explained where a recognition mark is formed in a step other than a through electrode formation step. As shown in step S21 of FIG. 27, first, elements is are formed at the front surface 8a of the wafer 8. Namely, the elements is such as transistors, are formed at a surface layer including the insulating layer 1p and the protection film 1q over the base substrate 1r including silicon.

Next, through electrode formation is performed. Here, the metal layer 1m is formed over the front surface 8a of the wafer 8, and after that, the through electrodes 1c electrically coupled to the metal layer 1m are formed in the wafer 8. It should be noted that front surfaces of the respective through electrodes 1c are covered with the insulating film 1t of $SiO_2$ (also including TiN) or the like, which prevents diffusion of the through electrodes 1c.

Next, after the copper post bumps 5 are formed at the pads 1d, the carrier 11 is applied to the wafer 8 via the adhesive 12. Furthermore, back surface polishing shown in step S22 is performed. Namely, the polishing of the back surface 8b of the wafer 8 held by the carrier 11 projects tips of the through electrodes 1c.

Next, back surface bump formation shown in step S23 of FIG. 28 is performed. Here, the bump 1e is formed at the each tip of the respective through electrodes 1c.

Next, mark formation shown in step S24 is performed. For example, recognition marks 1k are formed, by plating or the like, on the back surface 8b of the wafer 8.

As described above, the recognition marks 1k are formed in the step other than the through electrode formation step, and thus it is possible to form a shape of the recognition marks 1k completely different from the array shape of the through electrodes 1c. Namely, there can be formed the recognition marks 1k having completely changed size, form, pitch or the like differently from the recognition marks 1h.

It should be noted that, as shown in FIG. 30, in the through electrodes 1c arrayed in a matrix form, the following are defined by JEDEC (Joint Electron Device Engineering Council standards): X=50 μm; Y=40 μm, X and Y being pitches between adjacent electrodes; and φ=20 μm, φ being a diameter of the electrode.

Accordingly, when the recognition marks 1k are formed in the step other than the through electrode formation step, the pitches and the diameter are not limited to the above numerical values, and the recognition mark 1k may be formed by changing pitch, size, form or the like, or may be formed in the same pitch, diameter, and form as the above.

Meanwhile, the first modification shown in FIG. 29 illustrates a case where the recognition marks 1h are formed simultaneously in the through electrode formation step.

First of all, elements is are formed at the front surface 8a of the wafer 8. Namely, the elements is such as transistors, are formed at the surface layer including the insulating layer 1p and the protection film 1q over the base substrate 1r including silicon.

Next, as shown in step S31, a plurality of through electrodes 1v for the recognition marks 1h are formed together with the through electrodes 1c in the through electrode formation step. First, the metal layer 1m is formed over the front surface 8a of the wafer 8, and after that, the through electrodes 1c and 1v electrically coupled to the metal layer 1m are formed in the wafer 8. It should be noted that front surfaces of the respective through electrodes 1c and 1v are covered with the insulating film it of $SiO_2$ (also including TiN) or the like, which prevents diffusion of the through electrodes 1c and 1v.

Furthermore, after the copper post bumps 5 are formed on the pads 1d, the carrier 11 is applied to the wafer 8 through the adhesive 12. After that, back surface polishing shown in step S32 is performed. Namely, the polishing of the back surface 8b of the wafer 8 held by the carrier 11 projects respective tips of the through electrodes 1c and 1v.

Next, mark formation (back surface bump formation) shown in step S33 is performed. Here, the bump 1e is formed at the respective tips of the through electrodes 1c projecting to the back surface 8b of the wafer 8, and the recognition mark 1h is formed at the respective tips of the through electrodes 1v. It should be noted that the bumps 1e and the recognition marks 1h are, for example, formed by plating or the like.

It should be noted that when the recognition mark 1h is formed simultaneously in the through electrode formation step, the recognition marks 1h are represented as an aggregate of stipples (patterns 1ha) or a single stipple.

Since the recognition marks 1h are formed simultaneously in the through electrode formation step as described above, and thus the through electrodes 1v for the recognition marks can be formed simultaneously with the through electrode 1c by using a sheet of mask, the plurality of recognition marks 1h can be formed with high accuracy.

Furthermore, the step of forming the recognition marks 1h can be omitted, and as a result, the recognition marks 1h can be efficiently formed.

In addition, also in the case where the recognition marks 1h are formed simultaneously in the through electrode formation step, it is also possible to change pitches and sizes of the adjacent through electrodes 1v, and to change a shape of the through electrode 1v differently from that of the through electrode 1c. For example, only the above-described pitch X may be changed, and only the above-described pitch Y may be changed, or both of the above-described pitches X and Y may be changed.

However, the through electrodes 1v may be formed to have the same pitch, diameter, and shape as the through electrodes 1c.

Next, using FIG. 31, there will be explained formation positions of the recognition marks 1h in a case where a shape of the back surface 1b of the logic chip 1 is substantially square.

The through electrodes 1c are arranged in a matrix form in a center of the back surface 1b of the logic chip 1. Accordingly, it is necessary to secure a cell region around the through electrodes 1c. Consequently, the recognition marks 1h are, as shown in FIG. 31, preferably formed at positions away from a region of the back surface 1b where the through electrodes 1c have been arranged. For example, the positions are end regions such as corners of the back surface 1b.

As a result, the cell region can be sufficiently secured.

Furthermore, the recognition marks 1h are formed at the positions (ends of the back surface 1b) away from the region where the through electrodes 1c of the back surface 1b have been arranged, and thus a recognition rate of the recognition marks 1h can be increased. Namely, the recognition marks 1h are formed at the position sufficiently away from the bumps 1e coupled to the through electrodes 1c, whereby the recognition marks 1h are easily recognized in being imaged by the cameras 14 and 19, and the recognition rate of the recognition mark 1h can be increased.

However, when the recognition marks 1h are formed at a position near the region where the bumps 1e (through electrodes 1c) have been arranged as shown in the logic chip 1 of FIG. 22, a distance of the bump 1e and the recognition mark 1h is short, and thus chip mounting accuracy in the case of performing flip-chip coupling can be increased.

Accordingly, although the recognition marks 1h are preferably formed at the position away from the bumps 1e (through electrodes 1c) in order to increase the recognition rate of the recognition marks 1h, when the chip mounting accuracy at the time of flip-chip coupling needs to be increased, the recognition marks 1h may be formed at the position near the bumps 1e (through electrodes 1c).

Next, other modifications will be explained.

Figure 32:
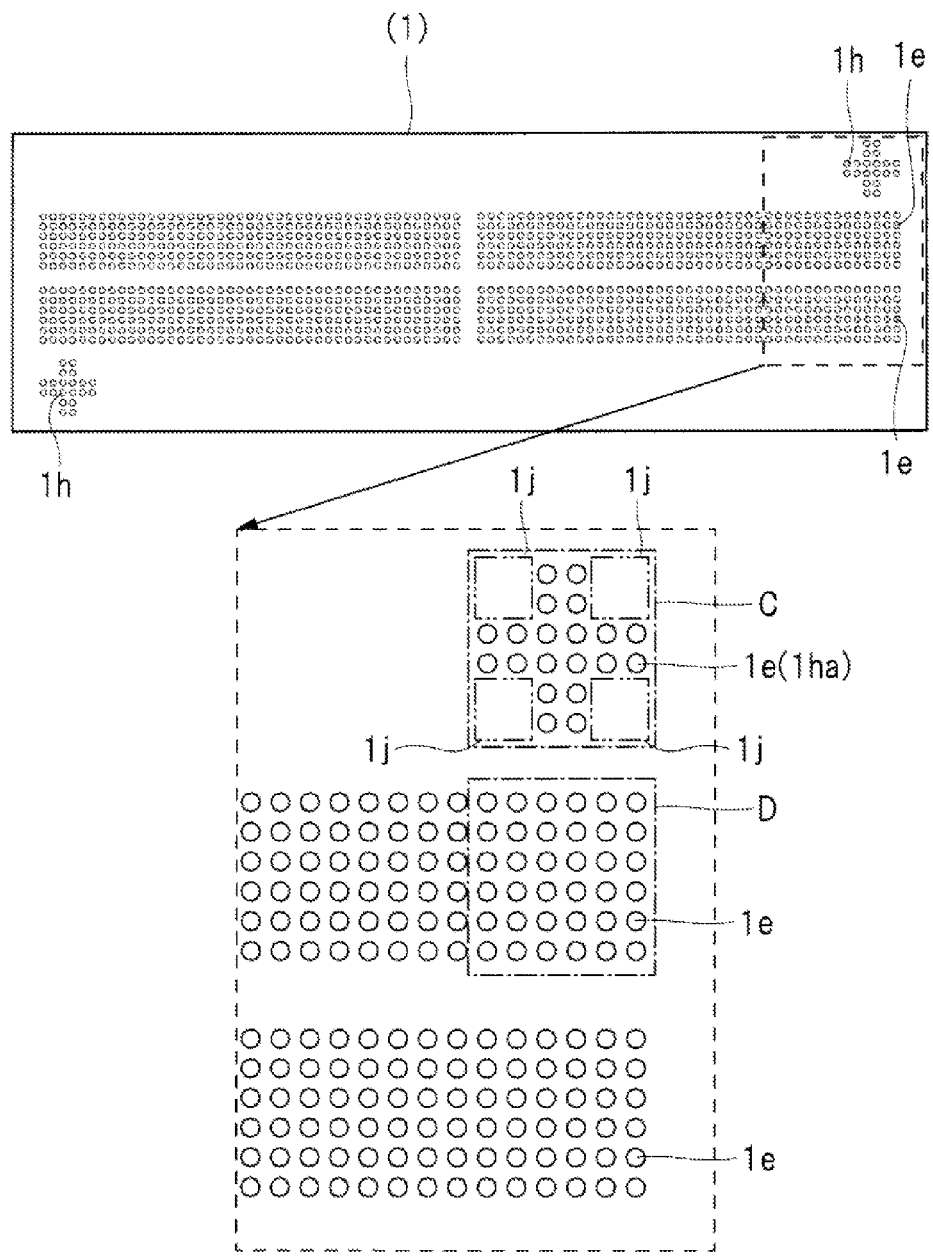
FIG. 32 shows a plan view and an enlarged partial plan view illustrating shapes of a recognition range of a second modification.
Figure 33:
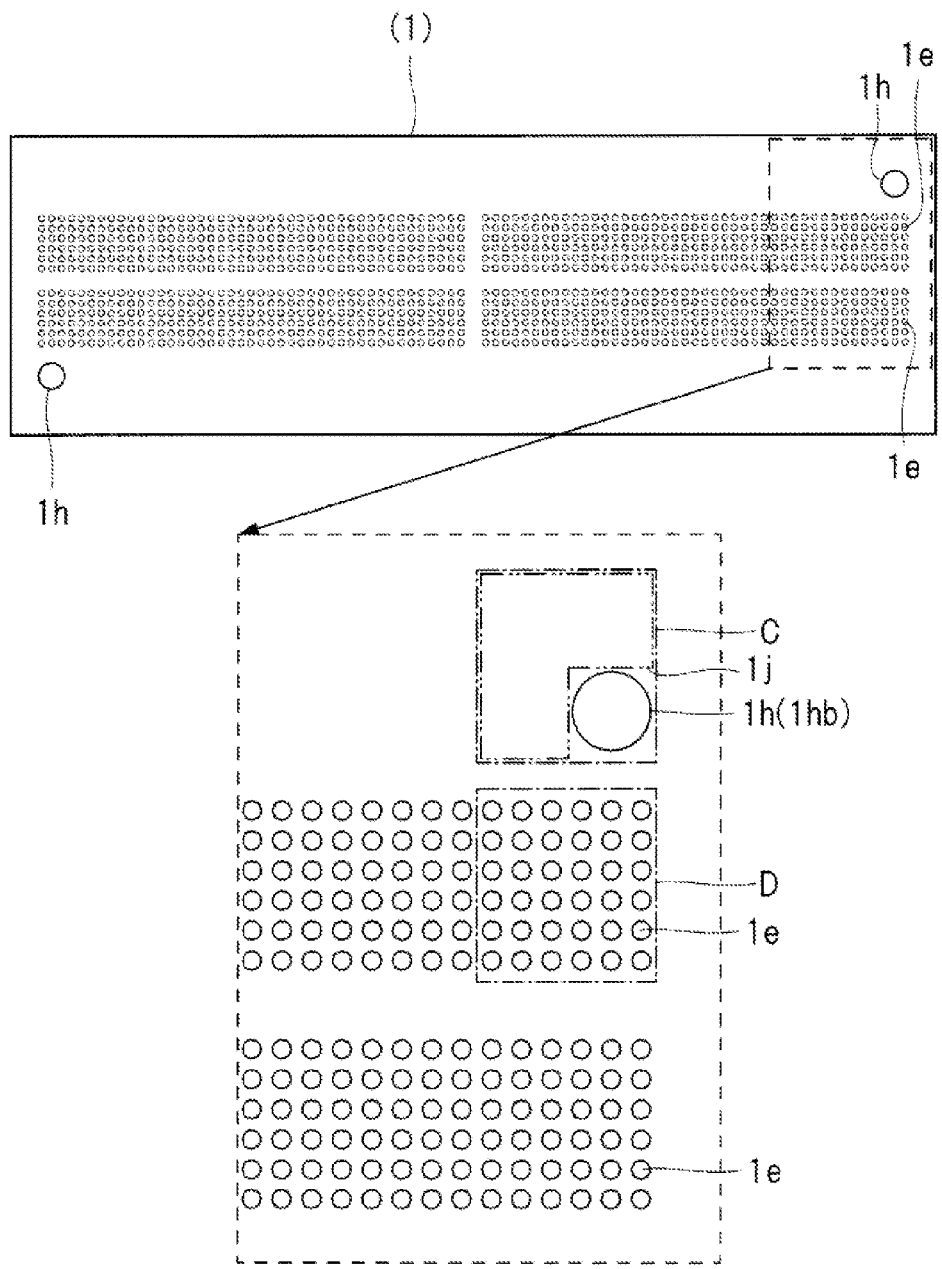
FIG. 33 shows a plan view and an enlarged partial plan view illustrating shapes of a recognition range of a third modification.
Figure 34:
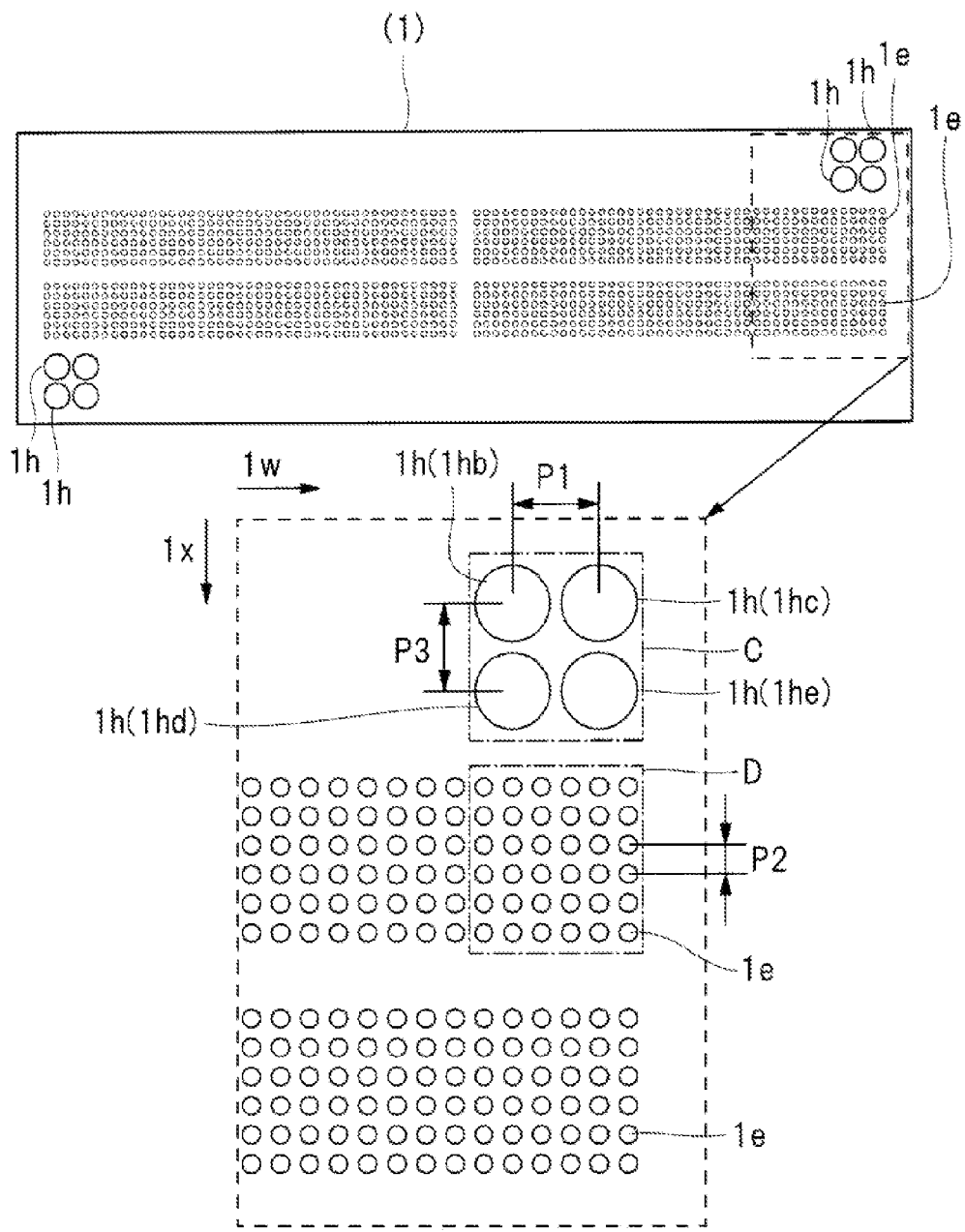
FIG. 34 shows a plan view and an enlarged partial plan view illustrating shapes of a recognition range of a fourth modification.
Figure 35:
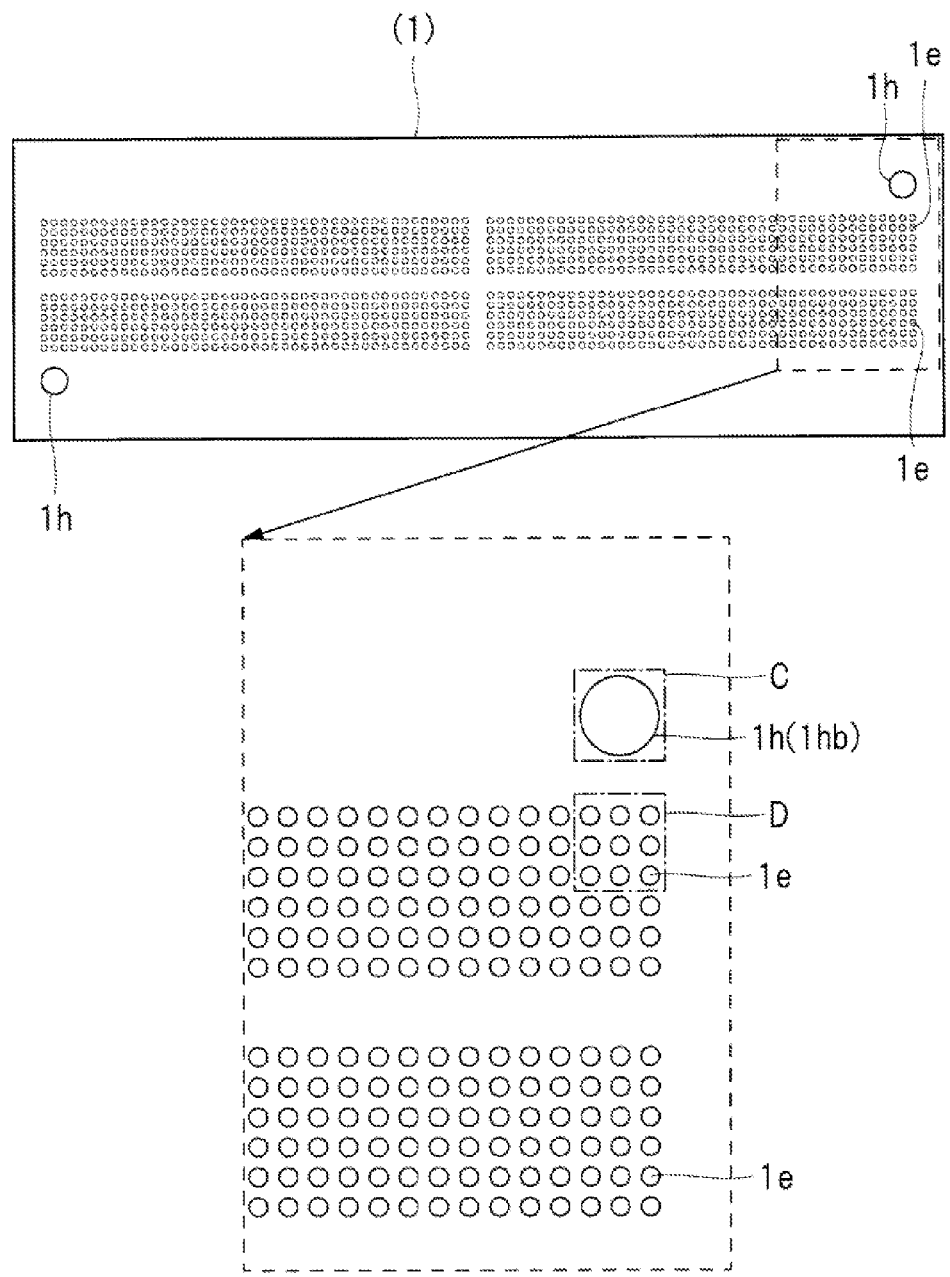
FIG. 35 shows a plan view and an enlarged partial plan view illustrating shapes of a recognition range of a fifth modification.
Figure 36:
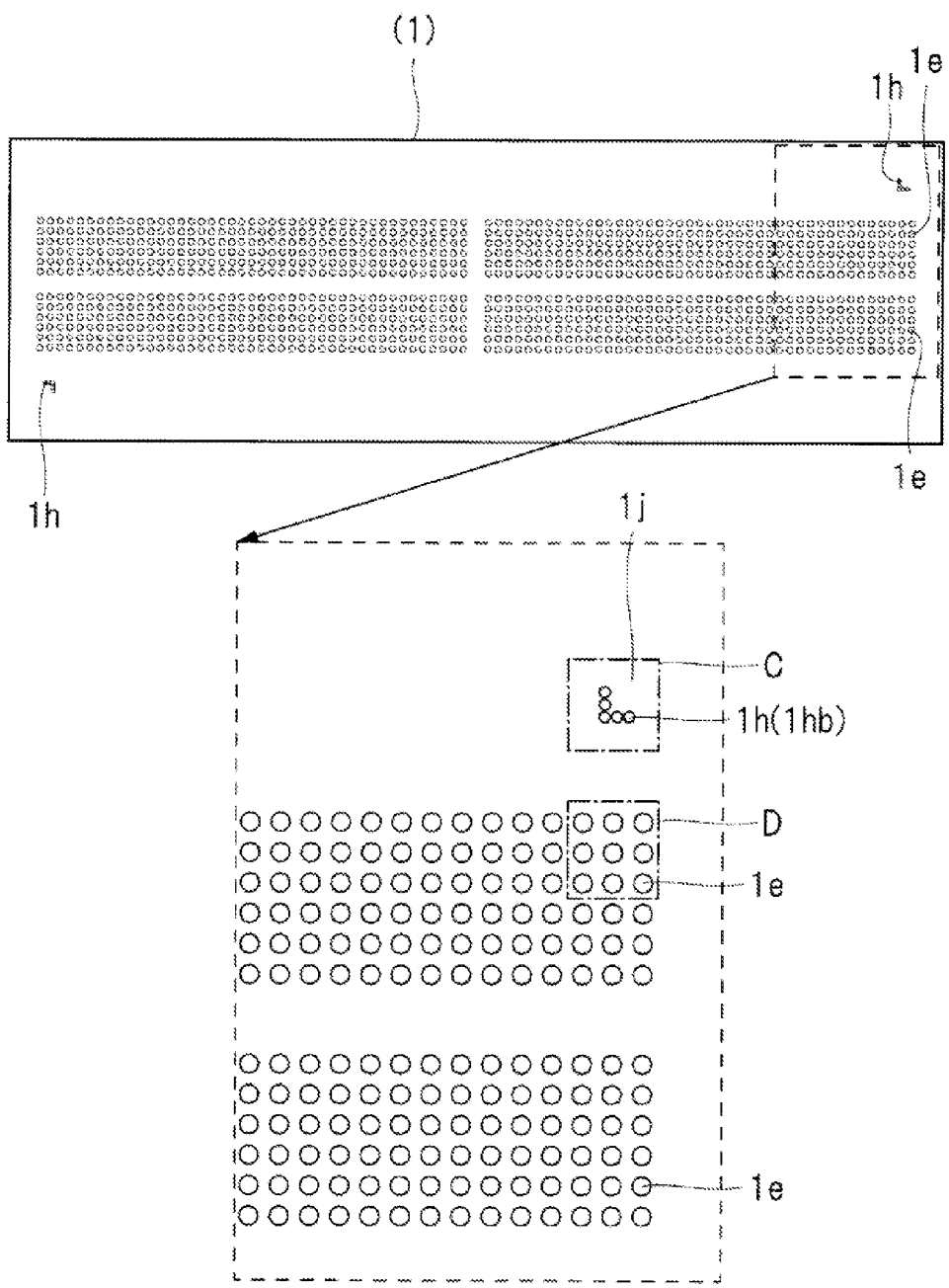
FIG. 36 shows a plan view and an enlarged partial plan view illustrating shapes of a recognition range of a sixth modification.
Figure 37:
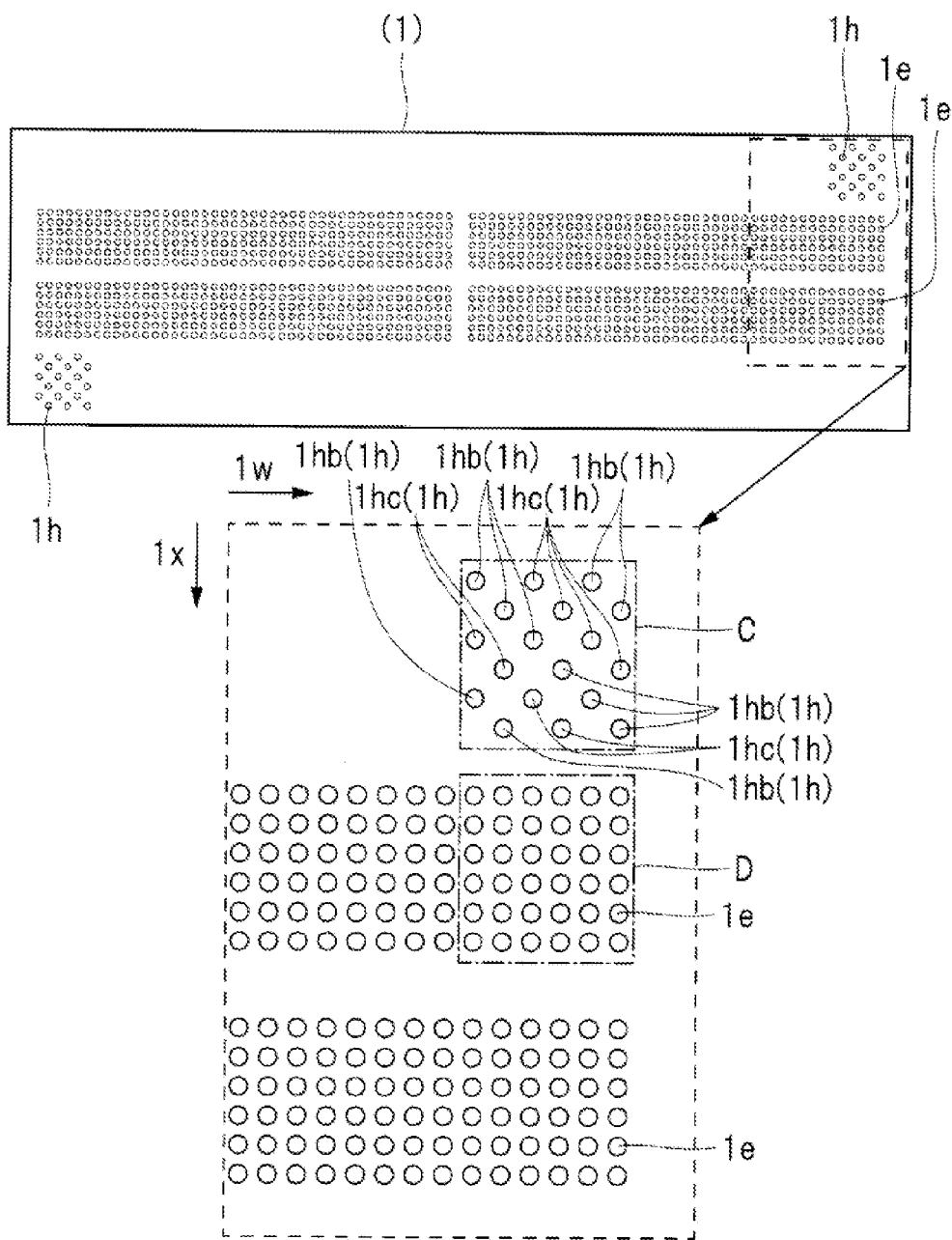
FIG. 37 shows a plan view and an enlarged partial plan view illustrating shapes of a recognition range of a seventh modification.
Figure 38:
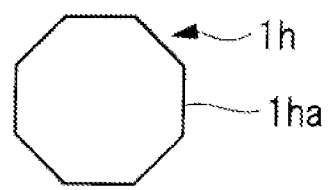
FIG. 38 is an enlarged plan view illustrating a shape of a recognition range of an eighth modification.
Figure 39:
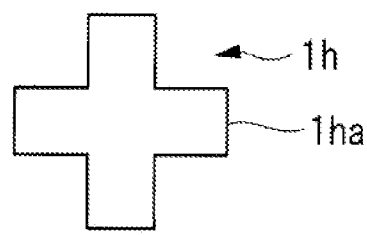
FIG. 39 is an enlarged plan view illustrating a shape of a recognition range of a ninth modification.
Figure 40:
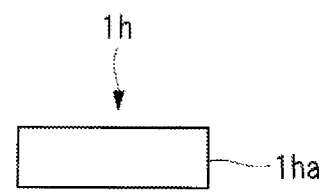
FIG. 40 is an enlarged plan view illustrating a shape of a recognition range of a tenth modification.
Figure 41:
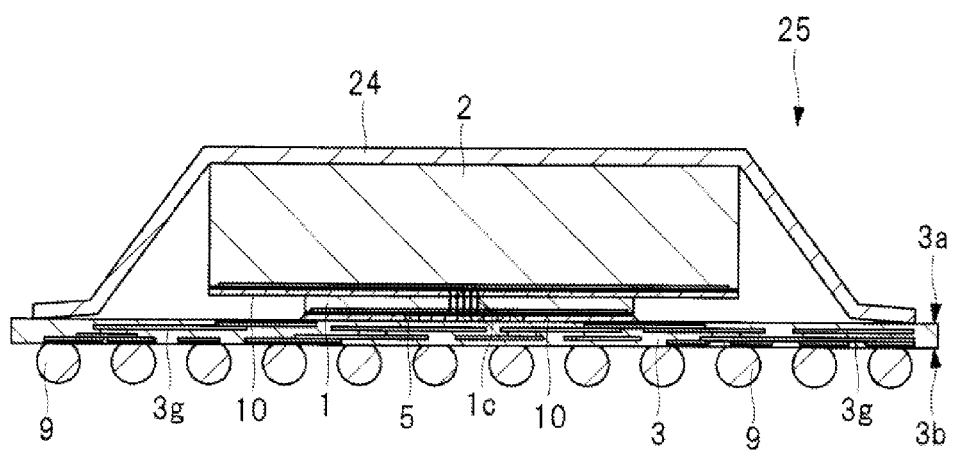
FIG. 41 is a cross-sectional view illustrating a structure of a semiconductor device of an eleventh modification of the embodiment.
Figure 42:
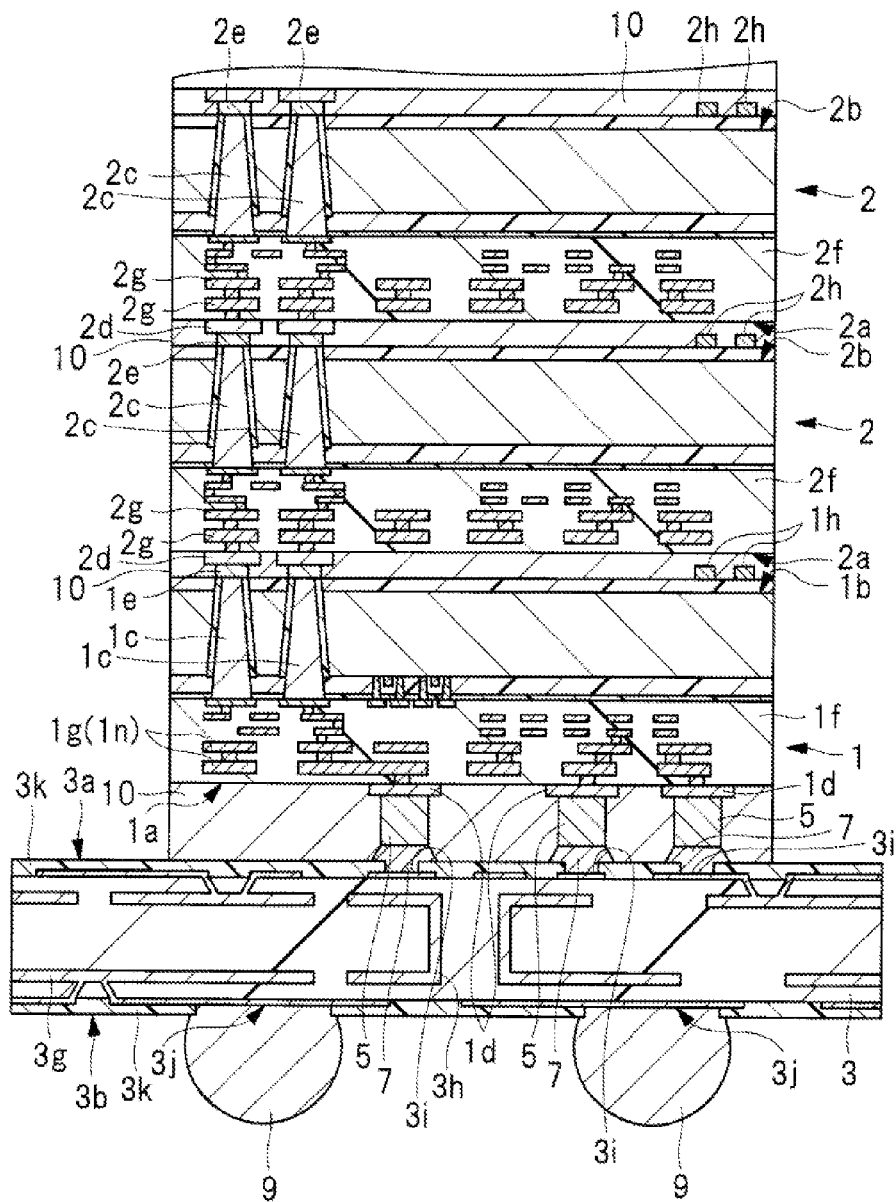
FIG. 42 is an enlarged partial cross-sectional view illustrating a structure of a semiconductor device of a twelfth modification of the embodiment.
Figure 43:
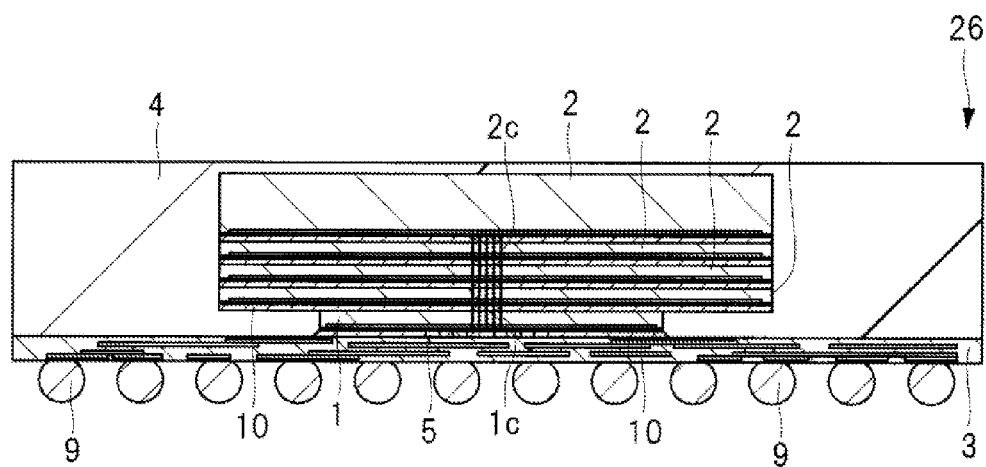
FIG. 43 is a cross-sectional view illustrating a structure of a semiconductor device of a thirteenth modification of the embodiment.
Figure 44:
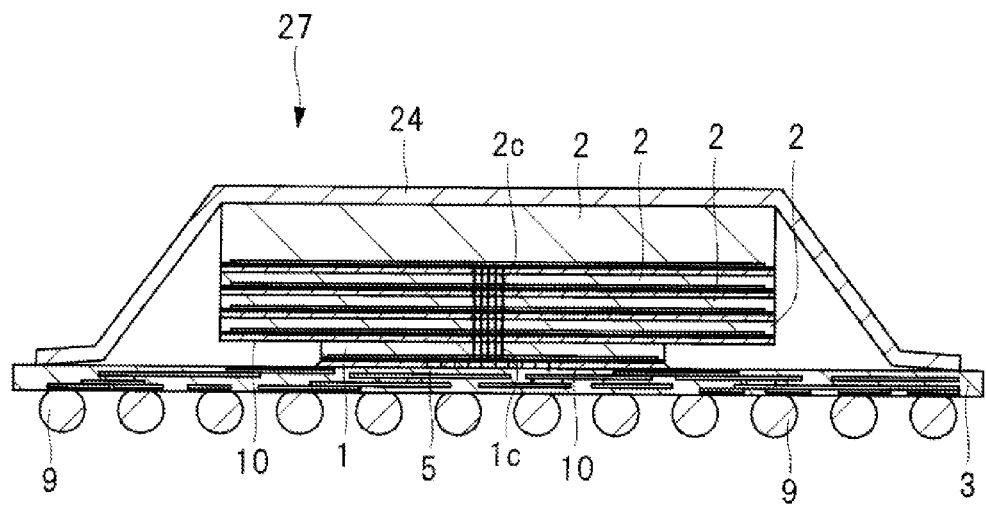
FIG. 44 is a cross-sectional view illustrating a structure of a semiconductor device of a fourteenth modification of the embodiment.

FIG. 32 shows a plan view and an enlarged partial plan view illustrating shapes of a recognition range of a second modification, FIG. 33 shows a plan view and an enlarged partial plan view illustrating shapes of a recognition range of a third modification, FIG. 34 shows a plan view and an enlarged partial plan view illustrating shapes of recognition range of a fourth modification, FIG. 35 shows a plan view and an enlarged partial plan view illustrating shapes of a recognition range of a fifth modification, and FIG. 36 shows a plan view and an enlarged partial plan view illustrating shapes of a recognition range of a sixth modification. In addition, FIG. 37 shows a plan view and an enlarged partial plan view illustrating shapes of a recognition range of a seventh modification, FIG. 38 is an enlarged plan view illustrating a shape of a recognition range of an eighth modification, FIG. 39 is an enlarged plan view illustrating a shape of a recognition range of a ninth modification, and FIG. 40 is an enlarged plan view illustrating a shape of a recognition range of a tenth modification. Furthermore, FIG. 41 is a cross-sectional view illustrating a structure of a semiconductor device of an eleventh modification of the embodiment, FIG. 42 is an enlarged partial cross-sectional view illustrating structure of a semiconductor device of a twelfth modification of the embodiment, FIG. 43 is a cross-sectional view illustrating a structure of a semiconductor device of a thirteenth modification of the embodiment, and FIG. 44 is cross-sectional view illustrating a structure of a semiconductor device of a fourteenth modification of the embodiment.

Note that, although in the modifications of FIGS. 32 to 37, for convenience, there will be taken up and explained a case where a shape of the back surface of the chip is a rectangle, and where the recognition marks 1h are formed at the positions near the region where the bumps 1e have been arranged, it is needless to say that the shape of the back surface of the chip, and an arrangement relationship of the recognition marks 1h and the bumps 1e may be an almost square shape similarly to the logic chip 1 shown in FIG. 31.

The second modification shown in FIG. 32 illustrates a modification of the recognition marks 1h, the recognition mark 1h includes an aggregate of the patterns 1ha, and has a + shape in a planar view, and the recognition range C including the recognition mark 1h has, at four points (four corners), the second region 1j where the patterns 1ha are not arranged.

Meanwhile, since the imaging range D does not have a region corresponding to the above-described second region 1j, a shape in the recognition range C and an array shape in the imaging range D are definitely different from each other, and both are not similar patterns (similar shapes).

As a result, when the camera 14 of FIG. 24 and the camera 19 of FIG. 25 image the back surface 1b of the logic chip 1, false recognition of the array shape of the imaging range D as the shape of the recognition range C to be recognized, can be reduced.

In addition, the third modification shown in FIG. 33 also illustrates a modification of the recognition mark 1h, the recognition mark 1h includes a single first pattern 1hb, and represents a circle in the planar view. Furthermore, although respective areas of the bumps 1e are equal to each other, an area of the first pattern 1hb and the respective areas of the bumps 1e are different from each other, and the area of the first pattern 1hb is much larger than the respective areas of the bumps 1e.

It should be noted that, also in the third modification, the recognition range C including the recognition mark 1h has the second region 1j where the first pattern 1hb is not arranged.

Meanwhile, since the imaging range D does not have the region corresponding to the above-described second region 1j, a shape in the recognition range C and an array shape in the imaging range D are definitely different from each other, and both are not similar patterns (similar shapes).

As a result, when the camera 14 of FIG. 24 and the camera 19 of FIG. 25 image the back surface 1b of the logic chip 1, false recognition of the array shape of the imaging range D as the shape of the recognition range C to be recognized, can be reduced.

In addition, the area of the first pattern 1hb is much larger than the area of each of the bumps 1e, and sizes of the first pattern 1hb and the bump 1e are obviously different from each other, and thus a recognition rate of the recognition range C including the recognition mark 1h can be further increased.

In addition, the fourth modification shown in FIG. 34 also illustrates a modification of the recognition mark 1h, and the recognition mark 1h has the first pattern 1hb, a second pattern 1hc, a third pattern 1hd, and a fourth pattern 1he. Here, when viewed on the basis of the first pattern 1hb, the second pattern 1hc is arranged along a first direction 1w, and the third pattern 1hd is arranged along a second direction 1x perpendicular to the first direction 1w. Furthermore, the fourth pattern 1he is arranged along the first direction 1w on the basis of the third pattern 1hd.

It should be noted that the first pattern 1hb, the second pattern 1hc, the third pattern 1hd, and the fourth pattern the are respectively circular in the planar view, and that areas of the respective patterns are equal to each other, and furthermore, the respective areas of the respective patterns are different from the respective areas of the bumps 1e.

Namely, each of the circular areas (sizes) of the first pattern 1hb, the second pattern 1hc, the third pattern 1hd, and the fourth pattern the is obviously different from the area (size) of each of the bumps 1e. That is, each of the areas of the respective patterns is obviously larger than the area (size) of each of the bumps 1e.

In addition, a distance P1 between pitches of the first pattern 1hb and the second pattern 1hc is larger than a distance P2 between the pitches of the respective bumps 1e, and a relation of P1>P2 is satisfied. Furthermore, a distance P3 between pitches of the first pattern 1hb and the third pattern 1hd is larger than the distance P2 between the pitches of the respective bumps 1e, and a relation of P3>P2 is satisfied.

Namely, since in the fourth modification, sizes of the individual pattern and the each bump 1e are completely different from one another, and arrangement pitches with the adjacent patterns (bumps 1e) thereof are also definitely different from one another, a shape of the recognition range C and the array shape of the imaging range D are certainly different from each other, and both are further obviously different shapes in the fourth modification.

Accordingly, when the camera of FIG. 24 and the camera of FIG. 25 image the back surface 1b of the logic chip 1, false recognition of the array shape of the imaging range D as the shape of the recognition range C to be recognized, can be further reliably reduced.

In addition, the fifth modification shown in FIG. 35 also illustrates a modification of the recognition mark 1h, and the recognition mark 1h includes the single first pattern 1hb, and is circular in the planar view. Furthermore, although respective areas of the bumps 1e are equal to each other, an area of the first pattern 1hb and the area of each of the bumps 1e are different from each other, and the area of the first pattern 1hb is much larger than the area of each of the bumps 1e.

Accordingly, a shape in the recognition range C and an array shape in the imaging range D are certainly different from each other, and both are not similar patterns (similar shapes).

As a result, when the camera 14 of FIG. 24 and the camera 19 of FIG. 25 image the back surface 1b of the logic chip 1, false recognition of the array shape of the imaging range D as the shape in the recognition range C to be recognized, can be reduced.

Furthermore, an area of the recognition range C of the fifth modification of FIG. 35 corresponds to an area of one first pattern 1hb, and is much smaller as compared with the recognition range C of FIG. 22.

Accordingly, an area of the cell region can be largely secured by narrowing the recognition range C.

In addition, the sixth modification shown in FIG. 36 also illustrates a modification of the recognition mark 1h, and the recognition mark 1h includes a plurality of first patterns 1hb, and has an L shape in the planar view. Furthermore, although respective areas of the first patterns 1hb are equal to each other, they are different from the respective areas of the bumps 1e, and the area of the first pattern 1hb is much smaller than the area of each of the bumps 1e.

In addition, an arrangement pitch of the first patterns 1hb and an arrangement pitch of the bumps 1e are also different from each other, and the arrangement pitch of the first patterns 1hb is much smaller than that of the bumps 1e.

It should be noted that, also in the sixth modified embodiment, the recognition range C including the recognition mark 1h has the second region 1j where the first pattern 1hb is not arranged.

Accordingly, a shape in the recognition range C and an array shape in the imaging range D are definitely different from each other, and both are not similar patterns (similar shapes).

As a result, when the camera 14 of FIG. 24 and the camera 19 of FIG. 25 image the back surface 1b of the logic chip 1, false recognition of the array shape of the imaging range D as the shape in the recognition range C to be recognized, can be reduced.

Furthermore, also in the sixth modified embodiment, an area of the cell region can be largely secured since the recognition range C is narrow.

In addition, the seventh modification shown in FIG. 37 also illustrates a modification of the recognition mark 1h, the recognition mark 1h includes the first patterns 1hb and second patterns 1hc, and the first pattern 1hb and the second pattern 1hc are alternately lined up in a staggered arrangement in the first direction 1w and the second direction 1x.

It should be noted that areas of the first pattern 1hb and the second pattern 1hc are equal to each other, and that the area of each of the first pattern 1hb and the second pattern 1hc is also equal to the area of each of the bumps 1e.

However, the first patterns 1hb and second patterns 1hc are alternately lined up in the staggered arrangement, and an arrangement pitch of the first pattern fhb and the second pattern 1hc is approximately twice as large as the arrangement pitch of the bumps 1e.

Accordingly, since both arrangement pitches are completely different from each other, a shape in the recognition range C and an array shape in the imaging range D are certainly different from each other, and both are not similar patterns (similar shapes).

As a result, when the camera 14 of FIG. 24 and the camera 19 of FIG. 25 image the back surface 1b of the logic chip 1, false recognition of the array shape of the imaging range D as the shape in the recognition range C to be recognized, can be reduced.

Next, the modifications shown in FIGS. 38 to 40 show the modifications of a shape of one pattern 1ha of the recognition marks 1h in the planar view. First, the eighth modification shown in FIG. 38 is a case where the shape of one pattern 1ha of the recognition marks 1h is an octagon in the planar view. In addition, the ninth modification shown in FIG. 39 is a case where the shape of one pattern 1ha of the recognition marks 1h is the + shape in the planar view. Furthermore, the tenth modification shown in FIG. 40 is a case where the shape of one pattern 1ha of the recognition marks 1h is a shape in the planar view.

As described above, even if the shape of one pattern 1ha of the recognition marks 1h is set to be the shapes of the modifications shown in FIGS. 38 to 40, there can be obtained a similar effect to the case of being the circle shown in FIG. 22.

Next, the modifications shown in FIGS. 41 to 44 are the modifications regarding the structure of the semiconductor device.

First, the eleventh modification shown in FIG. 41 illustrates a BGA (semiconductor device) 25 in which the logic chip 1 and the memory chip 2 stacked thereover are not resin-sealed but are sealed by a case 24. Also in this BGA 25, in a flip-chip coupling step and a probe inspection step in the assembly thereof, the recognition range C including the recognition mark 1h as shown in FIG. 22 is recognized, and thus alignment of narrow-pitch electrodes at the time of flip-chip coupling of the memory chip 2 to be stacked and alignment of the probe needles 21 (refer to FIG. 25) with the narrow-pitch electrodes at the time of the probe inspection can be performed with high accuracy. As a result, assemblability of the BGA 25 can be enhanced.

In addition, a stacked structure of the twelfth modification of FIG. 42 shows a semiconductor device in which a plurality of memory chips 2 has been stacked over the logic chip 1. Namely, the semiconductor device has the structure in which the logic chip 1 has been mounted over the package substrate 3 through the copper post bumps 5, and in which the memory chips 2 have been stacked over the logic chip 1.

At this time, the through electrodes 1c and 2c are formed in the logic chip 1 and each of the memory chips 2 stacked thereover. The through electrodes 1c and 2c are formed penetrating a silicon base portion, and are via wirings that electrically couple electrodes of the front and back surfaces of the chip. Namely, the through electrodes 1c and 2c are the electrodes formed by boring through-holes in the chip in a wafer state, and embedding conductive materials therein, and they are effective for stacking a number of semiconductor chips in a state where a narrow pad pitch is maintained.

Consequently, the through electrode 1c in the logic chip 1 electrically couples the copper post bumps 5 coupled to the pads 1d of the front surface 1a, and the bumps 1e provided on the back surface 1b side on a side opposite thereto, via the wiring portions 1g formed at the insulating layer 1f of a surface layer.

Meanwhile, the through electrodes 2c in the memory chip 2 electrically couples the pads 2d provided on the front surface 2a, and the bumps 2e provided on a back surface 2b side on a side opposite thereto, via wiring portions 2g similarly formed at an insulating layer 2f of a surface layer.

It should be noted that, in a stacked layer of the logic chip 1 and the memory chips 2 (second semiconductor chips or third semiconductor chips) of the upper-stage side of the logic chip 1, the bumps 1e directly coupled to the through electrodes 1c of the logic chip 1, and the pads 2d of the front surface 2a side of the memory chip 2 are electrically coupled to one another. Furthermore, the stacked structure is the structure in which the bumps 2e of an upper surface side that are directly coupled to the through electrodes 2c of a second-stage memory chip 2, and the pads 2d of a lower surface side of a third-stage memory chip 2 have been electrically coupled to one another. The second-stage memory chip 2 and the third-stage memory chip 2 are the same chips.

For example, when the third-stage memory chip 2 is stacked over the second-stage memory chip 2, alignment is performed by recognizing recognition marks 2h formed on the back surface 2b of the second-stage memory chip 2, and thus alignment can be performed with high accuracy between the second-stage memory chip 2 and the third-stage memory chip 2.

Here, as one example of a semiconductor device in which the structure shown in FIG. 42 has been resin-sealed, there is illustrated a BGA 26 of the thirteenth modification of FIG. 43.

In addition, as one example of a semiconductor device in which the structure shown in FIG. 42 has been sealed by the case 24, there is illustrated a BGA 27 of the fourteenth modification of FIG. 44.

Also in the BGA 26 shown in FIG. 43 and the BGA 27 shown in FIG. 44, in flip-chip coupling steps and probe inspection steps in the assembly thereof, the recognition range C including the recognition mark 1h as shown in FIG. 22 is recognized, and thus alignment of narrow-pitch electrodes at the time of flip-chip coupling of the memory chips 2 to be stacked can be performed with high accuracy. Furthermore, alignment of the probe needles 21 (refer to FIG. 25) with the narrow-pitch electrodes at the time of a probe inspection can be performed with high accuracy. As a result, assemblability of the BGAs 26 and 27 can be improved.

Hereinbefore, although the invention made by the inventor has been specifically explained based on the embodiment, it is needless to say that the present invention is not limited to the above-described embodiment, and that various modifications can be made without departing from the gist of the invention.

For example, in the above-described embodiment and modifications, a BG tape other than a carrier or the like may be used as a support member that supports a wafer in an assembly step.

In addition, although the cases where the semiconductor device is the BGA have been taken up and explained in the above-described embodiment and modifications, the semiconductor device is not limited to the BGA, but may be, for example, an LGA (Land Grid Array) and the like, as long as the semiconductor has a structure in which a plurality of semiconductor chips is stacked over a wiring substrate.

In addition, the following embodiments may be included.

APPENDIX

[Paragraph 1]
A method for manufacturing a semiconductor device, including the steps of:
(a) preparing a first semiconductor chip that has a first main surface and a second main surface on a side opposite to the first main surface, and a second semiconductor chip that has a first main surface, and a second main surface on a side opposite to the first main surface; and
(b) mounting the second semiconductor chip over the first semiconductor chip so that the second main surface of the first semiconductor chip and the first main surface of the second semiconductor chip face each other, in which
a plurality of electrode pads arranged in a matrix form and a recognition mark are arranged over the second main surface of the first semiconductor chip,
a plurality of projection electrodes corresponding to the electrode pads of the first semiconductor chip is arranged over the first main surface of the second semiconductor chip,
the (b) step including the steps of:
(b1) imaging a recognition range including the recognition mark over the second main surface of the first semiconductor chip, and recognizing a shape of the recognition range;
(b2) performing alignment of the electrode pads of the first semiconductor chip and the projection electrodes of the second semiconductor chip based on a result of having recognized the shape of the recognition range; and
(b3) mounting the second semiconductor chip over the first semiconductor chip, and electrically coupling the electrode pads of the first semiconductor chip and the projection electrodes of the second semiconductor chip, and in which
the shape of the recognition range is different from any portion of an array shape of the electrode pads.

[Paragraph 2]
The method for manufacturing the semiconductor device according to paragraph 1, in which the first semiconductor chip is a logic chip provided with a microcomputer, and the second semiconductor chip is a memory chip.

[Paragraph 3]
The method for manufacturing the semiconductor device according to paragraph 2, in which a third semiconductor chip is mounted over the second semiconductor chip.

[Paragraph 4]
The method for manufacturing the semiconductor device according to paragraph 3, in which the second semiconductor chip and the third semiconductor chip are the same chips.

[Paragraph 5]
The method for manufacturing the semiconductor device according to paragraph 4, in which the third semiconductor chip is a memory chip.

[Paragraph 6]
The method for manufacturing the semiconductor device according to paragraph 1, including the step of, after the (b) step, sealing the first semiconductor chip, the second semiconductor chip, and the projection electrodes.

What is claimed is:
1. A method for manufacturing a semiconductor device, comprising the steps of:
(a) preparing a first semiconductor chip that has a first main surface and a second main surface on a side opposite to the first main surface, and a second semiconductor chip that has a first main surface, and a second main surface on a side opposite to the first main surface; and
(b) mounting the second semiconductor chip over the first semiconductor chip so that the second main surface of the first semiconductor chip and the first main surface of the second semiconductor chip face each other,
wherein a plurality of electrode pads arranged in a matrix form and a recognition mark are arranged over the second main surface of the first semiconductor chip,
wherein a plurality of projection electrodes corresponding to the electrode pads of the first semiconductor chip is arranged over the first main surface of the second semiconductor chip,
the (b) step including the steps of:
(b1) imaging a recognition range including the recognition mark over the second main surface of the first semiconductor chip, and recognizing a shape of the recognition range;
(b2) performing alignment of the electrode pads of the first semiconductor chip and the projection electrodes of the second semiconductor chip based on a result of having recognized the shape of the recognition range; and
(b3) mounting the second semiconductor chip over the first semiconductor chip, and electrically coupling the elec- trode pads of the first semiconductor chip and the projection electrodes of the second semiconductor chip, and
wherein the shape of the recognition range is different from any portion of an array shape of the electrode pads.

2. The method for manufacturing the semiconductor device according to claim 1,
wherein the recognition mark has a first pattern,
wherein respective areas of the electrode pads are equal to each other, and
wherein an area of the first pattern and the respective areas of the electrode pads are different from each other.

3. The method for manufacturing the semiconductor device according to claim 2,
wherein the area of the first pattern of the recognition mark is larger than the respective areas of the electrode pads.

4. The method for manufacturing the semiconductor device according to claim 2,
wherein the area of the first pattern of the recognition mark is smaller than the respective areas of the electrode pads.

5. The method for manufacturing the semiconductor device according to claim 1,
wherein the recognition mark has a first pattern and a second pattern, and pitch distances of the first pattern and the second pattern are larger than that of the respective electrode pads.

6. The method for manufacturing the semiconductor device according to claim 5,
wherein the recognition mark has a third pattern, and pitch distances of the first pattern and the third pattern are larger than that of the respective electrode pads.

7. The method for manufacturing the semiconductor device according to claim 6,
wherein, when viewed based on the first pattern, the second pattern is arranged in a first direction, and the third pattern is arranged in a second direction perpendicular to the first direction.

8. The method for manufacturing the semiconductor device according to claim 5,
wherein areas of the first and second patterns of the recognition mark are equal to each other, and
wherein the areas of the first and second patterns are different from the area of each of the electrode pads.

9. The method for manufacturing the semiconductor device according to claim 5,
wherein the areas of the first and second patterns of the recognition mark are equal to each other, and
wherein the respective areas of the first and second patterns are equal to the respective areas of the electrode pads.

10. The method for manufacturing the semiconductor device according to claim 1,
wherein the recognition range including the recognition mark has a first region where a plurality of patterns have been arranged, and a second region where a pattern is not arranged.

11. The method for manufacturing the semiconductor device according to claim 10,
wherein respective areas of the patterns of the recognition mark are equal to each other, and are different from the respective areas of the electrode pads.

12. The method for manufacturing the semiconductor device according to claim 1,
wherein the (b) step is performed by a chip mounting machine having: a camera that images the shape of the recognition range including the recognition mark; a recognition unit that stores image data imaged by the camera, and that processes the image data; and a chip mounting unit that positions and mounts a semiconductor chip based on the image data which the recognition unit has processed, and
wherein the (b2) step includes the step of making a comparison between image data of the shape of the recognition range previously stored in the recognition unit and newly imaged image data of the shape of the recognition range.

13. The method for manufacturing the semiconductor device according to claim 1,
wherein the first semiconductor chip has a plurality of through electrodes, and the through electrodes are electrically coupled to the respective electrode pads.

14. A method for manufacturing a semiconductor device, comprising the steps of:
(a) preparing a first semiconductor chip that has a first main surface and a second main surface on a side opposite to the first main surface, and a second semiconductor chip;
(b) measuring electrical characteristics of the first semiconductor chip; and
(c) mounting the second semiconductor chip over the first semiconductor chip determined to be good in the (b) step;
wherein a plurality of electrode pads arranged in a matrix form and a recognition mark are arranged over the second main surface of the first semiconductor chip,
the (b) step including the steps of:
(b1) imaging a recognition range including the recognition mark over the second main surface of the first semiconductor chip, and recognizing a shape of the recognition range;
(b2) performing alignment of the electrode pads of the first semiconductor chip and a plurality of probe needles, based on a result of having recognized the shape of the recognition range; and
(b3) bringing the probe needles into contact with the respective electrode pads of the first semiconductor chip, and measuring the electrical characteristics of the first semiconductor chip, and
wherein the shape of the recognition range is different from any portion of an array shape of the electrode pads.

15. The method for manufacturing the semiconductor device according to claim 14,
wherein the (b) step is performed in a state of a wafer.

16. The method for manufacturing the semiconductor device according to claim 15, further comprising the step of:
(d) after the step (b), dicing the wafer before the (c) step, and obtaining the first semiconductor chip determined to be good in the (b) step.

17. The method for manufacturing the semiconductor device according to claim 14, comprising the step of:
(e) before the (a) step, mounting the first semiconductor chip over a wiring substrate.

18. The method for manufacturing the semiconductor device according to claim 14,
wherein the (b) step is performed by a prober apparatus having: a camera that images the shape of the recognition range including the recognition mark; a recognition unit that stores image data imaged by the camera, and that processes the image data; the probe needles that make contact with the semiconductor chip based on the image data which the recognition unit has processed; and a measurement unit that measures the electrical characteristics of the semiconductor chip via the probe needles, and
wherein the (b2) step includes the step of making a comparison between image data of the shape of the recognition range previously stored in the recognition unit and newly imaged image data of the shape of the recognition range.

19. A method for manufacturing a semiconductor device, comprising the steps of:
(a) preparing a first semiconductor chip that has a first main surface and a second main surface on a side opposite to the first main surface, and a second semiconductor chip that has a first main surface, and a second main surface on a side opposite to the first main surface;
(b) measuring electrical characteristics of the first semiconductor chip; and
(c) mounting the second semiconductor chip over the first semiconductor chip so that the second main surface of the first semiconductor chip determined to be good in the (b) step and the first main surface of the second semiconductor chip face each other,
wherein a plurality of electrode pads arranged in a matrix form and a recognition mark are arranged over the second main surface of the first semiconductor chip,
wherein a plurality of projection electrodes corresponding to the electrode pads of the first semiconductor chip is arranged over the first main surface of the second semiconductor chip,
the (b) step including the steps of:
(b1) imaging a recognition range including the recognition mark over the second main surface of the first semiconductor chip, and recognizing a shape of the recognition range;
(b2) performing alignment of the electrode pads of the first semiconductor chip and a plurality of probe needles, based on a result of having recognized the shape of the recognition range; and
(b3) bringing the probe needles into contact with the respective electrode pads of the first semiconductor chip, and measuring the electrical characteristics of the first semiconductor chip,
the (c) step including the steps of:
(c1) imaging the recognition range including the recognition mark over the second main surface of the first semiconductor chip, and recognizing the shape of the recognition range;
(c2) performing alignment of the electrode pads of the first semiconductor chip and the projection electrodes of the second semiconductor chip, based on a result of having recognized the shape of the recognition range; and
(c3) mounting the second semiconductor chip over the first semiconductor chip, and electrically coupling the electrode pads of the first semiconductor chip and the projection electrodes of the second semiconductor chip, and
wherein the shape of the recognition range is different from any portion of an array shape of the electrode pads.

20. The method for manufacturing the semiconductor device according to claim 19,
wherein the shapes of the recognition range including the recognition mark imaged at the (b1) and (c1) steps are in common.

* * * * *